US012622213B1

(12) United States Patent
Donovan et al.

(10) Patent No.: US 12,622,213 B1
(45) Date of Patent: May 5, 2026

(54) CASSETTE HANDLE

(71) Applicant: MACOM Technology Solutions Holdings, Inc., Lowell, MA (US)

(72) Inventors: David Donovan, Lowell, MA (US); Tracy Flynn, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 18/608,734

(22) Filed: Mar. 18, 2024

(51) Int. Cl.
H01L 21/673 (2006.01)

(52) U.S. Cl.
CPC .. H01L 21/67379 (2013.01); H01L 21/67326 (2013.01)

(58) Field of Classification Search
CPC ........ B25J 11/008; B25J 15/0014; B25J 1/04; B25J 15/0206; H01L 21/67379; H01L 21/67326
See application file for complete search history.

(56) References Cited

U.S. PATENT DOCUMENTS

| | | | | |
|---|---|---|---|---|
| 1,041,949 A | * | 10/1912 | Bandemer | E04G 21/16 |
| | | | | 269/208 |
| 4,223,934 A | * | 9/1980 | Cauceglia | H05K 7/1415 |
| | | | | 294/34 |
| 9,119,996 B2 | * | 9/2015 | Vail | B25J 1/04 |
| 2015/0003953 A1 | * | 1/2015 | Vail | B25J 1/04 |
| | | | | 414/800 |
| 2022/0274265 A1 | * | 9/2022 | Bomsztyk | B25J 11/008 |

* cited by examiner

*Primary Examiner* — Lawrence Averick
(74) *Attorney, Agent, or Firm* — Sheridan Ross P.C.

(57) ABSTRACT

A cassette handle includes a body, a first foot, and a second foot. When in a position following the application of a force to the body, the first foot and the second foot can engage a cassette for semiconductor wafers or samples. When in another position following the removal of the applied force, or absent an application of a force to the body, the first foot and the second foot are disengaged from the cassette. Recesses and/or markers on the first foot and the second foot indicate when the first foot and the second foot are correctly engaged with the cassette. Where the cassette handle includes both recesses and markers, the markers may be inset within the recesses.

20 Claims, 28 Drawing Sheets

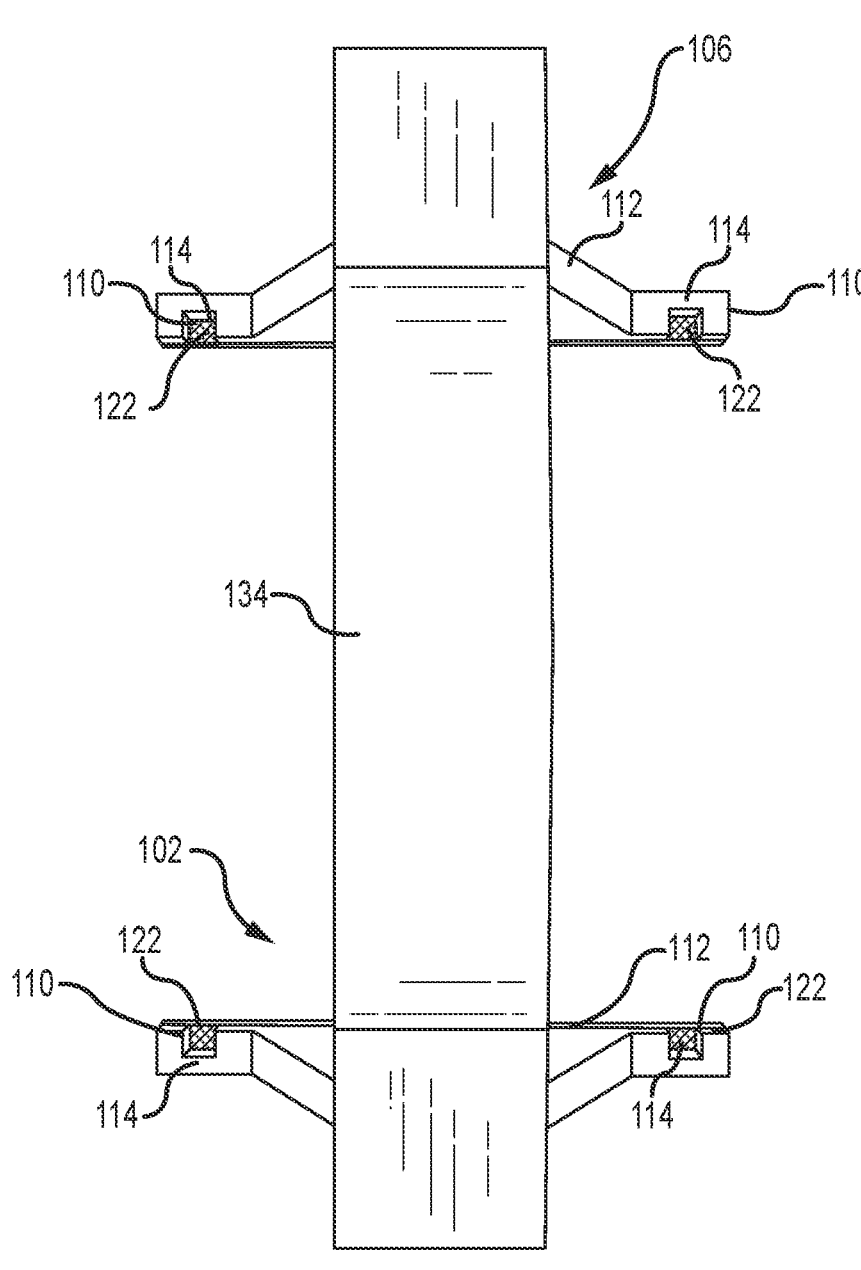
FIG.1F

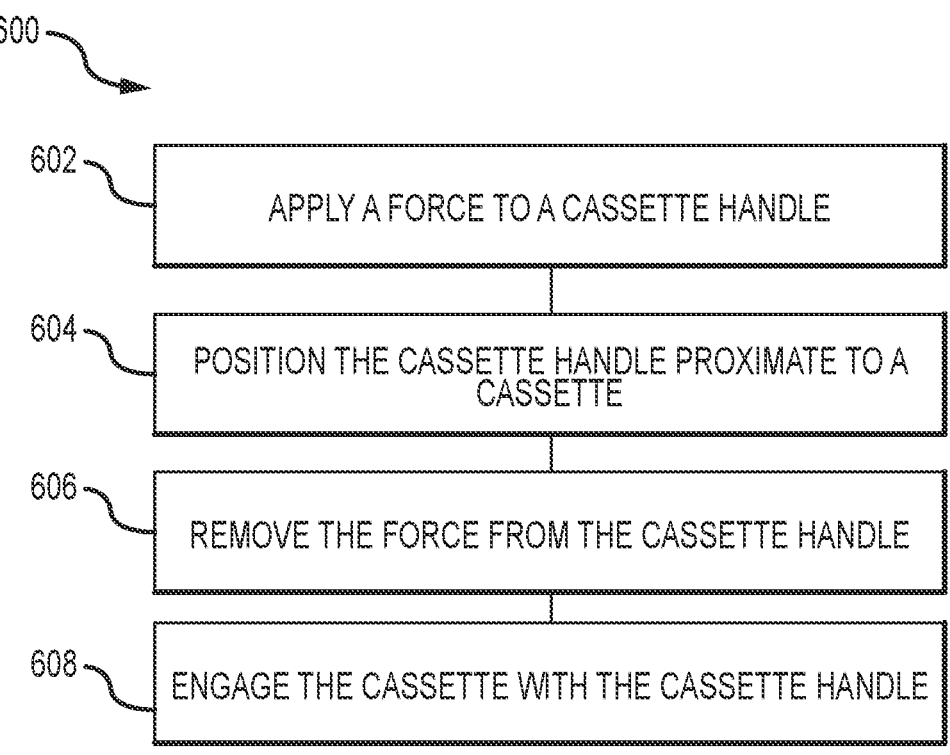

600

602　APPLY A FORCE TO A CASSETTE HANDLE

604　POSITION THE CASSETTE HANDLE PROXIMATE TO A CASSETTE

606　REMOVE THE FORCE FROM THE CASSETTE HANDLE

608　ENGAGE THE CASSETTE WITH THE CASSETTE HANDLE

FIG.6A

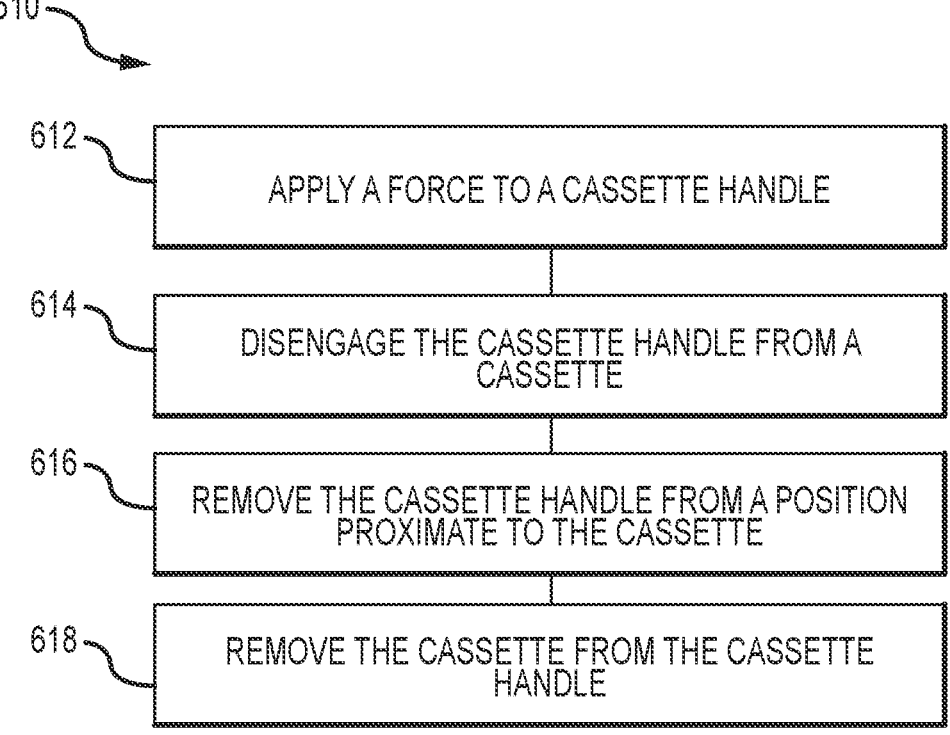

610

612　APPLY A FORCE TO A CASSETTE HANDLE

614　DISENGAGE THE CASSETTE HANDLE FROM A CASSETTE

616　REMOVE THE CASSETTE HANDLE FROM A POSITION PROXIMATE TO THE CASSETTE

618　REMOVE THE CASSETTE FROM THE CASSETTE HANDLE

FIG.6B

CASSETTE HANDLE

FIELD OF THE DISCLOSURE

The disclosure relates to semiconductor processing and, in particular, is directed to a cassette handle for use during the processing of semiconductors.

BACKGROUND

The background description includes information that may be useful in understanding the present inventive subject matter. It is not an admission that any of the information provided herein is prior art or relevant to the presently claimed disclosure, or that any publication specifically or implicitly referenced is prior art.

Wet chemistry procedures (or wet chemical procedures) of semiconductor wafers or samples may be used for chemical removal of material (i.e., wet etching), deposition of material (e.g., electroplating), and/or cleaning of the semiconductor wafer. Processing fluids such as acids, bases, solvents, etc. that may be used for the wet chemistry procedures can be harmful to an operator, such that contact with the processing fluids should be avoided.

One option for wet chemistry procedures includes dipping or submerging a cassette that houses the semiconductor wafers or samples in a processing bath containing the fluid. Following completion of the wet chemistry procedures on the semiconductor wafers or samples, the cassette must be removed from the bath without the operator making contact with the fluid. Where the cassette is improperly secured by the operator, the possibility of the cassette slipping and causing splashing or other movement of the fluid in the direction of the operator is increased, thus increasing the risk of harm to the operator.

SUMMARY

As such, there exists a need for a cassette handle, and a system and method for using the same, to remove a cassette that houses semiconductor wafers or samples from a processing bath, as well as insertion of the same into the processing bath prior to the wet chemistry procedures. The cassette handle should reduce or eliminate the possibility of contact with the processing fluids in the processing bath. To accomplish this, the cassette handle should provide an indicator to the operator that the cassette handle is properly attached to the cassette. The cassette handle should additionally be able to engage with (and disengage from) the cassette easily and efficiently via the method.

Embodiments of the present disclosure are directed to a cassette handle with a first leg and a second leg. The first leg and the second leg each include feet, with one or more contact points that are capable of engaging a cassette. When spread or open, each foot is able to receive (or release) one or more corresponding contact points on the cassette. When collapsed or closed, each foot is able to engage the one or more contact points on the cassette.

Embodiments of the present disclosure are also directed to the cassette handle including a body that joins together the first leg and the second leg. The body includes a first arm, a second arm, a crossmember, and optionally a head that define a cavity. The head and/or the crossmember operate as a living hinge, to allow the body to flex when a force is applied to at least one of the first sidewall and the second sidewall. The flexing of the body causes the first leg and the second leg to actuate outward from (or inward toward) a longitudinal axis through the body, altering the distance between the feet by increasing the distance between each foot and the longitudinal axis. The altering of the distance causes the opening and closing of the feet. In embodiments, the cassette handle is formed from a flexible material (i.e., plastic, either with or without a central flexible core fabricated from a metal or a second, different plastic) that has sufficient elasticity to allow for the spreading and collapsing of the feet via the living hinge portions of the head and/or the crossmember.

In some embodiments, the cassette handle includes aural and/or tactile indicators that inform an operator when the cassette handle is properly or correctly coupled to the cassette. For example, the indicators may include a clicking or snapping sound that occurs when the foot engages the cassette. For instance, a protrusion on the cassette may engage a recess in the foot, causing the clicking or snapping sound. It is noted that the engagement of the protrusion and the recess may be observed through a tactile sensation that transfers from the foot and through the body to the operator, where the operator is manipulating the body to cause the feet to engage the cassette.

In additional embodiments, the cassette handle includes visual indicators that inform an operator when the cassette handle is properly or correctly coupled to the cassette. For example, the indicators may include markers that are differentiable from the rest of the foot (and the cassette handle, in general). The markers may be positioned on a surface of the foot, including flush on the surface of the foot.

In further embodiments, the visual indicators, the aural indicators, and/or tactile indicators may be combined on the cassette handle. For example, the markers may be on a surface (or form the surface) inset within the recesses.

A first aspect of the present disclosure is to provide a cassette handle. The cassette handle includes a body to receive a force; a first foot in communication with a first side of the body, the first foot including a first set of recesses; and a second foot in communication with a second side of the body, the second foot including a second set of recesses. When the force is applied to the body, the first foot and the second foot actuate between a first position and a second position. When the first foot and the second foot are in the first position, the first set of recesses and the second set of recesses are disengaged from a cassette. When the first foot and the second foot are in the second position, the first set of recesses and the second set of recesses engage the cassette.

The cassette handle of the first aspect may include, optionally, wherein the first set of recesses are within a first set of surfaces of the first foot, wherein the second set of recesses are within a second set of surfaces of the second foot. When the first foot and the second foot are in the first position, the first set of recesses and the second set of recesses are disengaged from a respective set of protrusions on the cassette. When the first foot and the second foot are in the second position, the first set of recesses and the second set of recesses engage the respective set of protrusions on the cassette.

The cassette handle of the first aspect may include one or more of the previous embodiments and, optionally, wherein the first set of recesses includes a first set of markers, wherein the second set of recesses includes a second set of markers. When the first foot and the second foot are in the first position, the first set of recesses and the second set of recesses are disengaged from a respective set of protrusions of the cassette such that the first set of markers and the second set of markers are visible. When the first foot and the second foot are in the second position, the first set of recesses and the second set of recesses engage the respective set of protrusions of the cassette such that the first set of markers and the second set of markers are not visible.

The cassette handle of the first aspect may include one or more of the previous embodiments and, optionally, wherein the first set of recesses are within a first sidewall of the first foot, wherein the second set of recesses are within a second sidewall of the second foot. When the first foot and the second foot are in the first position, the first set of recesses and the second set of recesses are disengaged from a respective rim on the cassette. When the first foot and the second foot are in the second position, the first set of recesses and the second set of recesses engage the respective rim on the cassette.

The cassette handle of the first aspect may include one or more of the previous embodiments and, optionally, wherein the first set of recesses includes a first set of markers, wherein the second set of recesses includes a second set of markers. When the first foot and the second foot are in the first position, the first set of recesses and the second set of recesses are disengaged from the respective rim of the cassette such that the first set of markers and the second set of markers are visible. When the first foot and the second foot are in the second position, the first set of recesses and the second set of recesses engage the respective rim of the cassette such that the first set of markers and the second set of markers are not visible.

The cassette handle of the first aspect may include one or more of the previous embodiments and, optionally, wherein a longitudinal axis is defined through the body. When the first foot and the second foot are in the first position, the first foot and the second foot are at a first distance relative to the longitudinal axis through the body. When the first foot and the second foot are in the second position, the first foot and the second foot are at a second distance relative to the longitudinal axis through the body. The first distance is greater than the second distance.

The cassette handle of the first aspect may include one or more of the previous embodiments and, optionally, wherein the body includes a first arm in communication with the first foot; a second arm in communication with the second foot; and a crossmember positioned between and in communication with the first arm and the second arm. The first arm, the second arm, and the crossmember at least partially define a cavity within the body.

The cassette handle of the first aspect may include one or more of the previous embodiments and, optionally, when the force is applied to the first arm and the second arm, the crossmember flexes in response to the force applied to the first arm and the second arm. The first foot and the second foot transitions between the first position and the second position via the force applied to the first arm and the second arm.

The cassette handle of the first aspect may include one or more of the previous embodiments and, optionally, the crossmember becomes concave relative to the cavity defined within the body via the force applied to the first arm and the second arm.

The cassette handle of the first aspect may include one or more of the previous embodiments and, optionally, the body further includes a head coupled to the first arm and the second arm. The first arm, the second arm, the crossmember, and the head define the cavity within the body. The head flexes in response to the force applied to the first arm and the second arm.

The cassette handle of the first aspect may include one or more of the previous embodiments and, optionally, the head becomes concave relative to the cavity defined within the body via the force applied to the first arm and the second arm.

The cassette handle of the first aspect may include one or more of the previous embodiments and, optionally, further includes a first leg and a second leg. The first foot is coupled to the first side of the body via the first leg; and a second leg. The second foot is coupled to the second side of the body via the second leg.

A second aspect of the present disclosure is to provide a cassette handle. The cassette handle includes a body to receive a force; a first foot in communication with a first side of the body, the first foot including a first set of markers; and a second foot in communication with a second side of the body, the second foot including a second set of markers. When the force is applied to the body, the first foot and the second foot actuate between a first position and a second position. When the first foot and the second foot are in the first position, the first foot and the second foot are disengaged from a cassette such that the first set of markers and the second set of markers are visible. When the first foot and the second foot are in the second position, the first foot and the second foot engage with the cassette such that the first set of markers and the second set of markers are not visible.

The cassette handle of the second aspect may include, optionally, wherein the first set of markers are positioned in a first set of recesses within a first set of surfaces of the first foot. The second set of markers are positioned in a second set of recesses within a second set of surfaces of the second foot. When the first foot and the second foot are in the first position, the first set of recesses and the second set of recesses are disengaged from a respective set of protrusions on the cassette such that the first set of markers and the second set of markers are visible. When the first foot and the second foot are in the second position, the first set of recesses and the second set of recesses engage the respective set of protrusions on the cassette such that the first set of markers and the second set of markers are not visible.

The cassette handle of the second aspect may include one or more of the previous embodiments and, optionally, wherein the first set of markers are positioned on a first set of surfaces of the first foot. The second set of markers are positioned on a second set of surfaces of the second foot. When the first foot and the second foot are in the first position, the first set of surfaces and the second set of surfaces are disengaged from the cassette such that the first set of markers and the second set of markers are visible. When the first foot and the second foot are in the second position, the first set of surfaces and the second set of surfaces engage the cassette such that the first set of markers and the second set of markers are not visible.

The cassette handle of the second aspect may include one or more of the previous embodiments and, optionally, wherein the first set of markers are positioned in a first set of recesses within a first sidewall of the first foot. The second set of markers are positioned in a second set of recesses within a second sidewall of the second foot. When the first foot and the second foot are in the first position, the first set of recesses and the second set of recesses are disengaged from a respective rim on the cassette such that the first set of markers and the second set of markers are visible. When the first foot and the second foot are in the second position, the first set of recesses and the second set of recesses engage the respective rim on the cassette such that the first set of markers and the second set of markers are not visible.

A third aspect of the present disclosure is to provide a method for coupling a cassette handle to a cassette. The method may include, but is not limited to, applying a force to the cassette handle. The method may include, but is not limited to, positioning the cassette handle proximate to the cassette. The method may include, but is not limited to, removing the force from the cassette handle. The method may include, but is not limited to, engaging the cassette with the cassette handle.

The method of the third aspect may include, optionally, wherein the cassette handle includes a plurality of recesses. The plurality of recesses is disengaged from the cassette prior to removal of the force of the cassette handle. The plurality of recesses engages the cassette after removal of the force of the cassette handle.

The method of the third aspect may include one or more of the previous embodiments and, optionally, wherein the cassette handle includes a plurality of markers within the plurality of recesses. The plurality of markers is visible prior to engagement of the cassette with the cassette handle. The plurality of markers is not visible after engagement of the cassette with the cassette hand.

The method of the third aspect may include one or more of the previous embodiments and, optionally, wherein the cassette handle includes a plurality of markers. The plurality of markers is visible prior to engagement of the cassette with the cassette handle. The plurality of markers is not visible after engagement of the cassette with the cassette handle.

The phrases "at least one," "one or more," and "and/or," as used herein, are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

Unless otherwise indicated, all numbers expressing quantities, dimensions, conditions, and so forth used in the specification and claims are to be understood as being modified in all instances by the term "about."

The use of "substantially" in the present disclosure, when referring to a measurable quantity (e.g., a diameter or other distance) and used for purposes of comparison, is intended to mean within 5% of the comparative quantity. The terms "substantially similar to," "substantially the same as," and "substantially equal to," as used herein, should be interpreted as if explicitly reciting and encompassing the special case in which the items of comparison are "similar to," "the same as" and "equal to," respectively.

As used herein, unless otherwise specified, the terms "about," "approximately," etc., when used in relation to numerical limitations or ranges, mean that the recited limitation or range may vary by up to 10%. By way of non-limiting example, "about 750" can mean as little as 675 or as much as 825, or any value therebetween. When used in relation to ratios or relationships between two or more numerical limitations or ranges, the terms "about," "approximately," etc. mean that each of the limitations or ranges may vary by up to 10%; by way of non-limiting example, a statement that two quantities are "approximately equal" can mean that a ratio between the two quantities is as little as 0.9:1.1 or as much as 1.1:0.9 (or any value therebetween), and a statement that a four-way ratio is "about 5:3:1:1" can mean that the first number in the ratio can be any value of at least 4.5 and no more than 5.5, the second number in the ratio can be any value of at least 2.7 and no more than 3.3, and so on.

The term "a" or "an" entity, as used herein, refers to one or more of that entity. As such, the terms "a" (or "an"), "one or more" and "at least one" can be used interchangeably herein.

The use of "including," "comprising," or "having" and variations thereof herein is meant to encompass the items listed thereafter and equivalents thereof as well as additional items. Accordingly, the terms "including," "comprising," or "having" and variations thereof can be used interchangeably herein. The use of "engaged with" and variations thereof herein is meant to encompass any direct or indirect connections between components.

It shall be understood that the term "means" as used herein shall be given its broadest possible interpretation in accordance with 35 U.S.C. § 112(f). Accordingly, a claim incorporating the term "means" shall cover all structures, materials, or acts set forth herein, and all of the equivalents thereof. Further, the structures, materials, or acts and the equivalents thereof shall include all those described in the summary, brief description of the drawings, detailed description, abstract, and claims themselves.

All external references are hereby incorporated by reference in their entirety whether explicitly stated or not.

These and other advantages will be apparent from the disclosure contained herein. The above-described embodiments, objectives, and configurations are neither complete nor exhaustive. The Summary is neither intended nor should it be construed as being representative of the full extent and scope of the present disclosure. Moreover, references made herein to "the present disclosure," or aspects thereof should be understood to mean certain embodiments of the present disclosure and should not necessarily be construed as limiting all embodiments to a particular description. The present disclosure is set forth in various levels of detail in the Summary as well as in the attached drawings and the Detailed Description and no limitation as to the scope of the present disclosure is intended by either the inclusion or non-inclusion of elements, components, etc. in this Summary. Additional aspects of the present disclosure will become more readily apparent from the Detailed Description, particularly when taken together with the drawings.

It is to be appreciated that any embodiment, feature, or aspect described herein can be claimed in combination with any other embodiment(s), feature(s), or aspect(s) as described herein, regardless of whether the features or aspects come from the same described embodiment. For example, any one or more aspects described herein can be combined with any other one or more aspects described herein. In addition, any one or more features described herein can be combined with any other one or more features described herein. Further, any one or more embodiments described herein can be combined with any other one or more embodiments described herein.

BRIEF DESCRIPTION OF THE DRAWINGS

Those of skill in the art will recognize that the following description is merely illustrative of the principles of the disclosure, which may be applied in various ways to provide many different alternative embodiments. This description is made for illustrating the general principles of the teachings of this disclosure and is not meant to limit the inventive concepts disclosed herein.

The accompanying drawings, which are incorporated in and constitute a part of the specification, illustrate embodiments and together with the general description of the disclosure given above and the detailed description of the drawings given below, serve to explain the principles of the disclosure.

FIG. 1F illustrates a top plan view of the cassette handle of FIG. 1A;

FIG. 6A illustrates a flow diagram of a method or process for the operation and use of a cassette handle in accordance with one or more embodiments of the present disclosure;

FIG. 6B illustrates a flow diagram of a method or process for the operation and use of a cassette handle in accordance with one or more embodiments of the present disclosure;

Figure 1A:
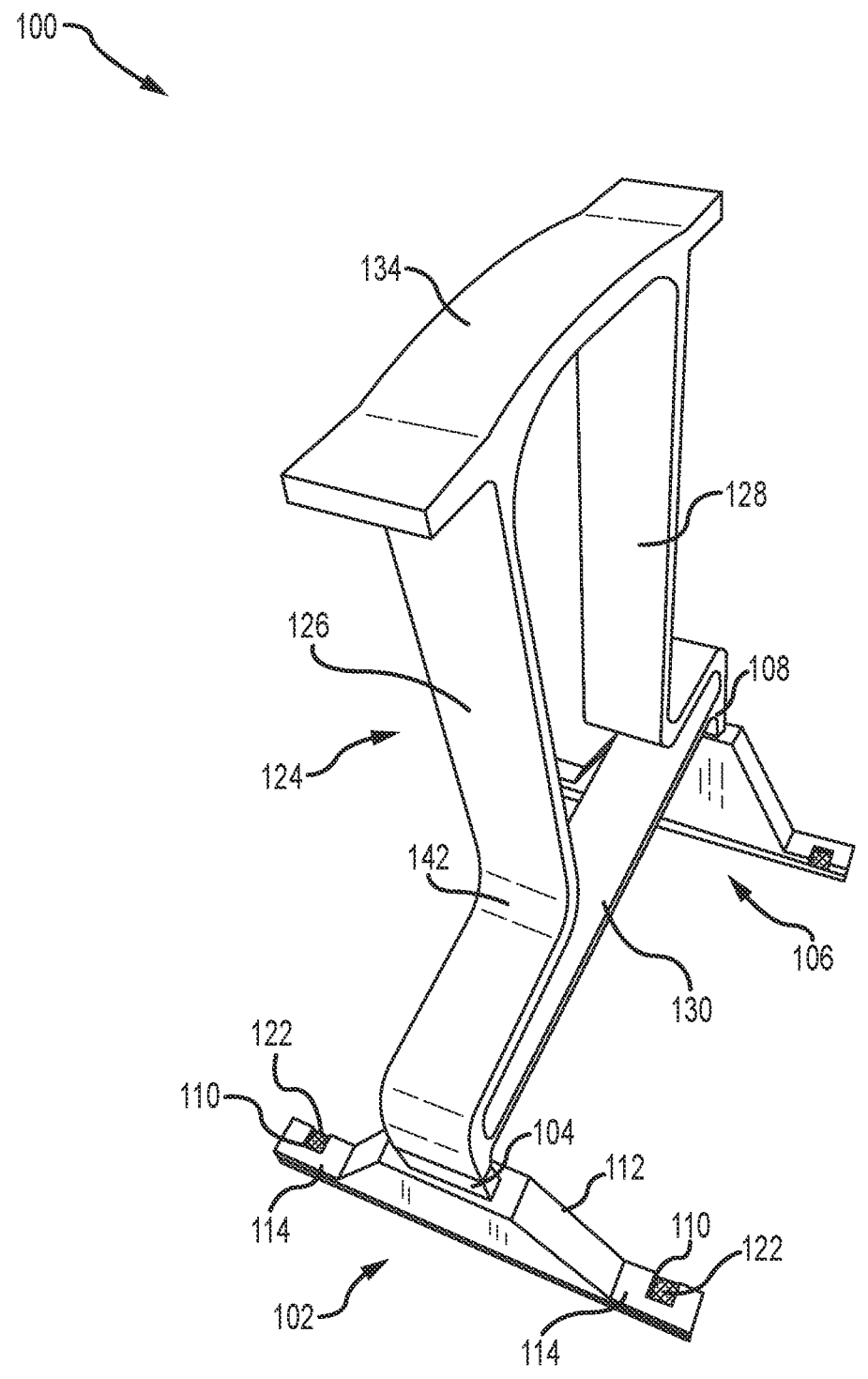
FIG. 1A illustrates a perspective view of a cassette handle, in accordance with one or more embodiments of the present disclosure.
Figure 1B:
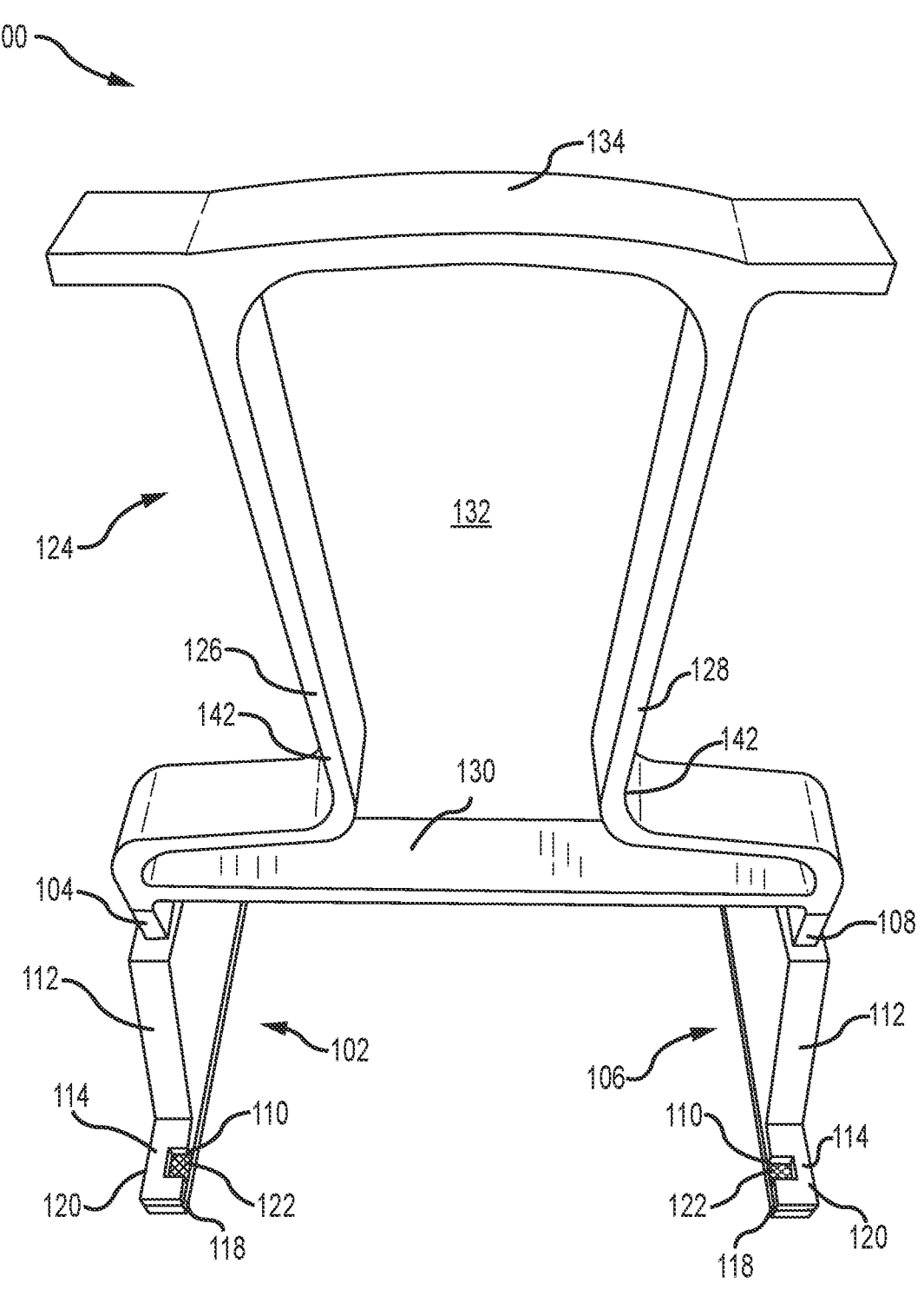
FIG. 1B illustrates a front perspective view of the cassette handle of FIG. 1A.
Figure 1C:
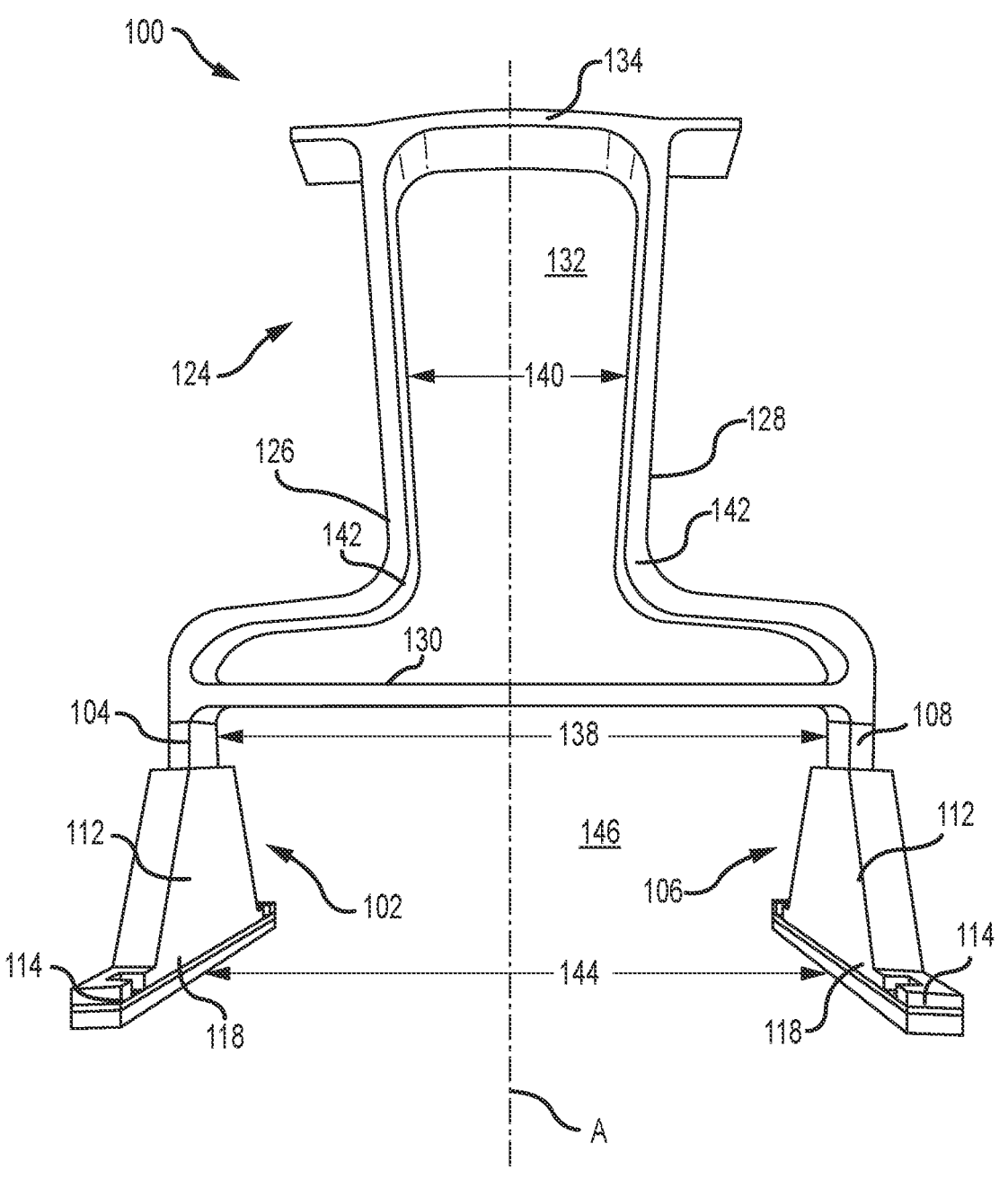
FIG. 1C illustrates a front elevation view of the cassette handle of FIG. 1A.
Figure 1D:
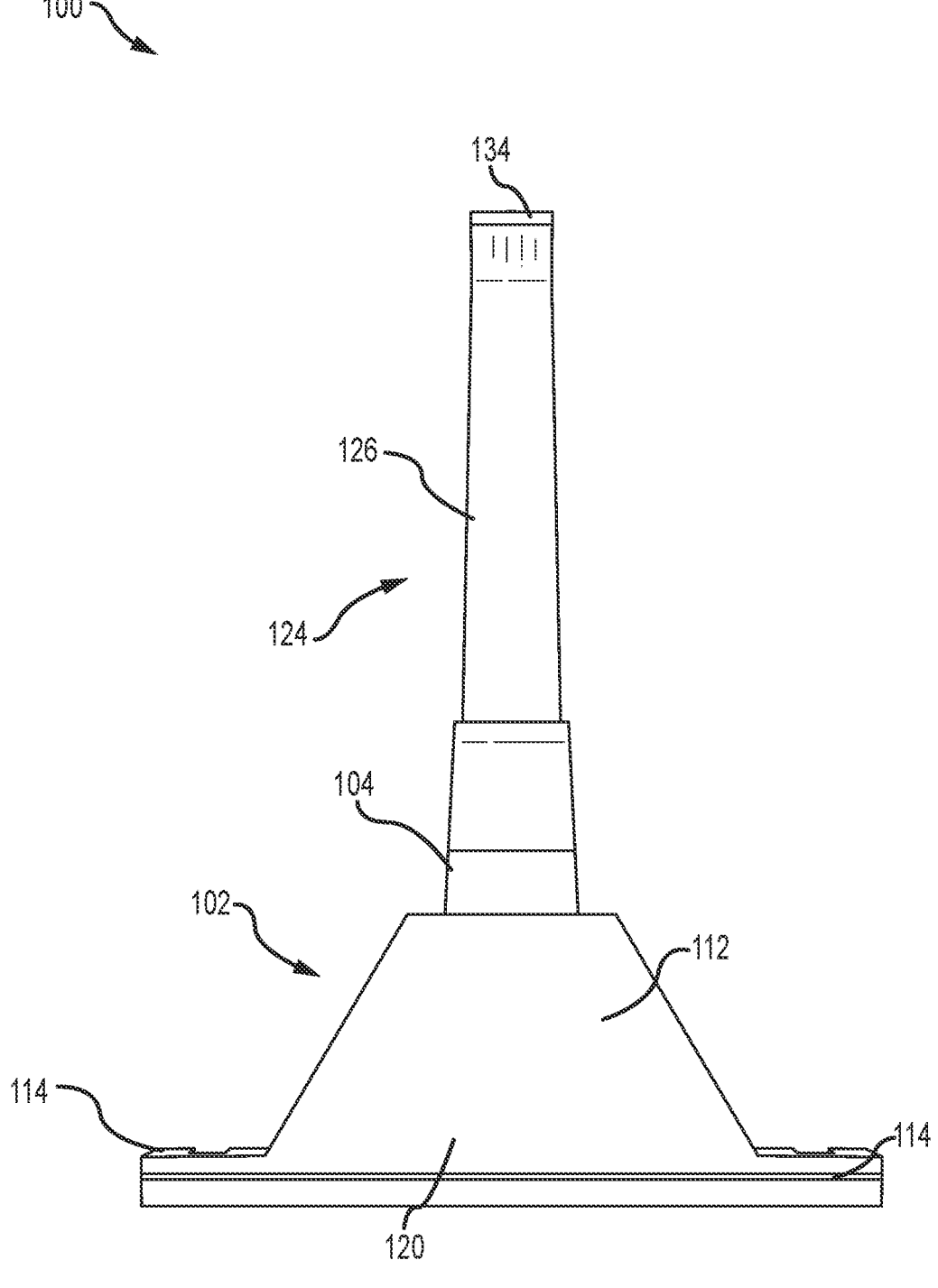
FIG. 1D illustrates a side elevation view of the cassette handle of FIG. 1A.
Figure 1E:
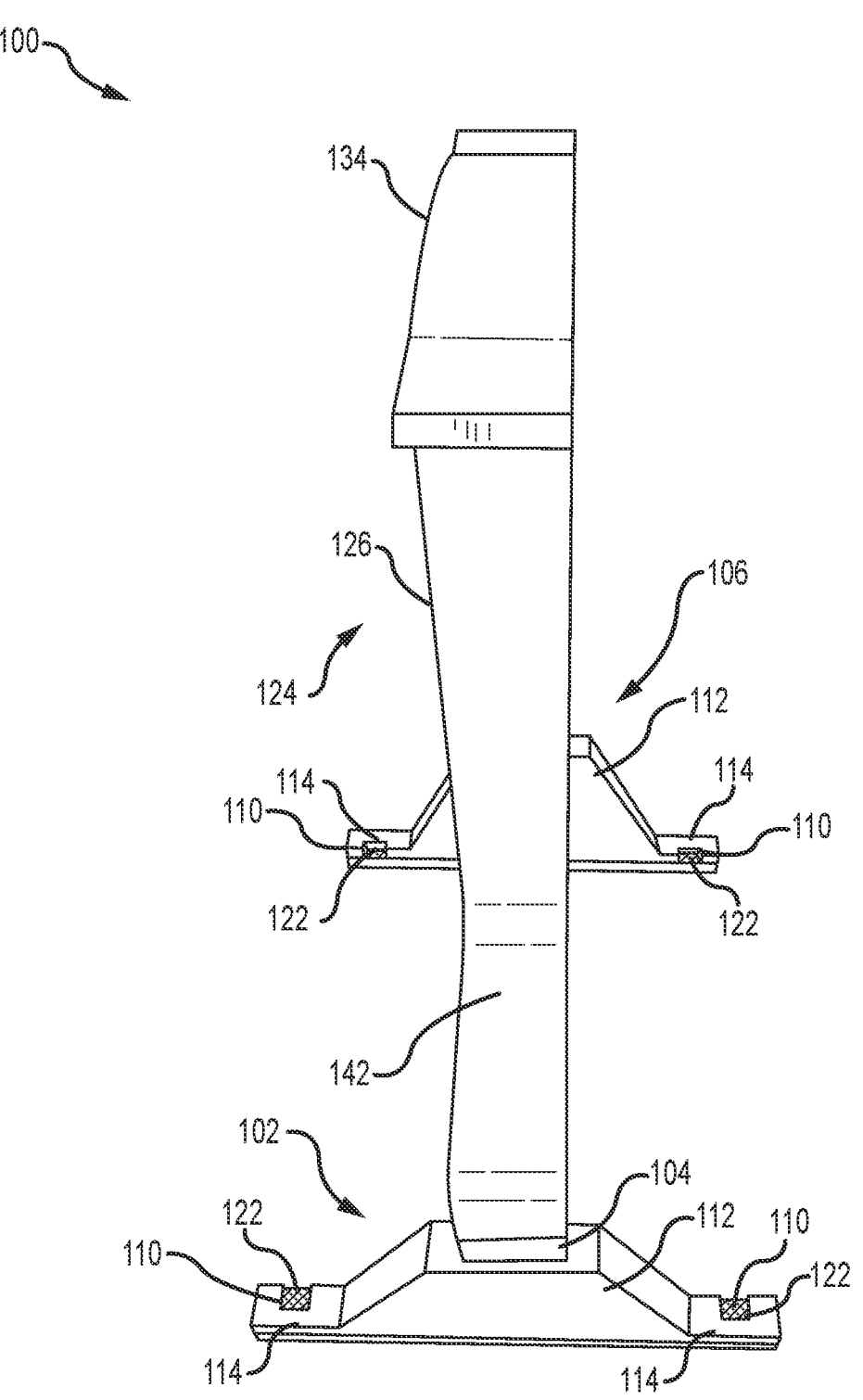
FIG. 1E illustrates a side perspective view of the cassette handle of FIG. 1A.
Figure 1G:
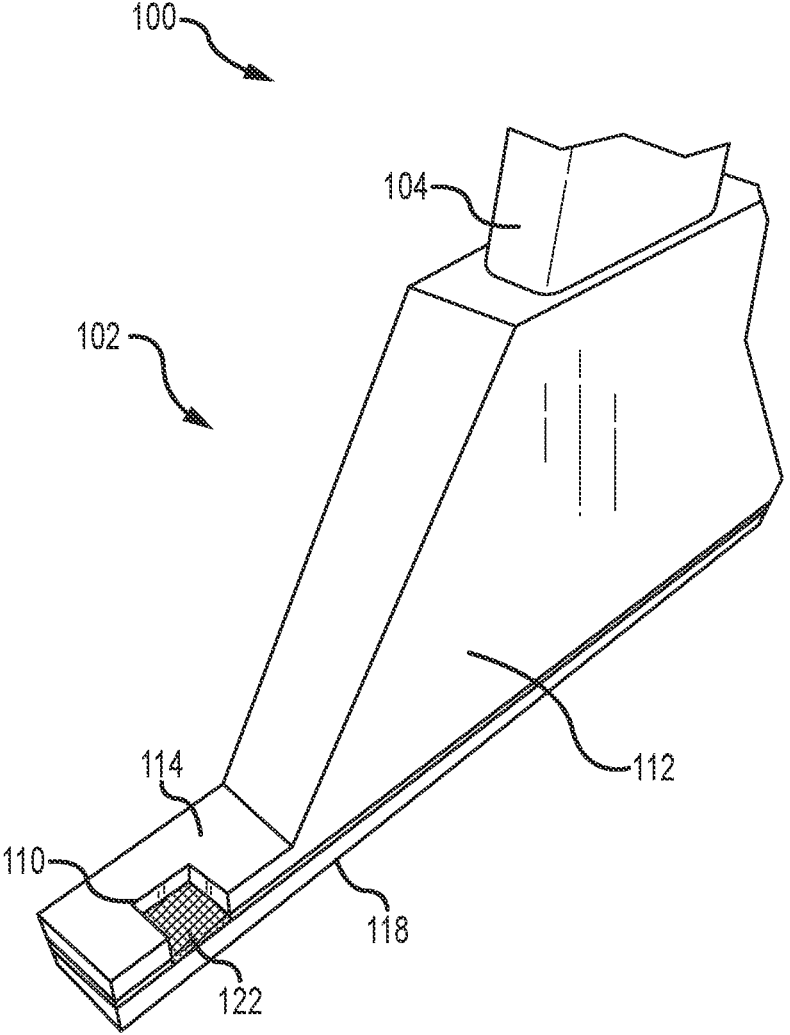
FIG. 1G illustrates a perspective view of a foot of the cassette handle of FIG. 1A.

It should be understood that the drawings are not necessarily to scale, and various dimensions may be altered. In certain instances, details that are not necessary for an understanding of the disclosure or that render other details difficult to perceive may have been omitted. It should be understood, of course, that the disclosure is not necessarily limited to the particular embodiments illustrated herein.

| Reference Number | Component |
|---|---|
| 100 | Cassette Handle |
| 102 | Foot |
| 104 | Leg |
| 106 | Foot |
| 108 | Leg |
| 110 | Recess |
| 112 | Main Portion |
| 114 | Flange |
| 116 | Surface |
| 118 | Sidewall |
| 120 | Sidewall |
| 122 | Marker |
| 124 | Body |
| 126 | Arm |
| 128 | Arm |
| 130 | Crossmember |
| 132 | Cavity |
| 134 | Head |
| 136 | Tab |
| 138 | Width |
| 140 | Width |
| 142 | Bend |
| 144 | Width |
| 146 | Cavity |
| 200 | Cassette |
| 202 | Housing |
| 204 | Slot |
| 206 | Rim |
| 208 | Side |
| 210 | Side |
| 212 | End |
| 214 | End |
| 216 | Protrusion |
| 218 | Height |
| 220 | Length |
| 222 | Width |
| 300 | System |
| 302 | Sidewall |
| 304 | Sidewall |
| 400 | Cassette Handle |
| 402 | Markers |
| 500 | Cassette Handle |
| 502 | Recess |
| 504 | Length |
| 506 | Markers |
| 600 | Process Flow Diagram |
| 602, 604 | Step |
| 606, 608 | Step |
| 610 | Process Flow Diagram |
| 612, 614 | Step |
| 616, 618 | Step |

DETAILED DESCRIPTION

Although the following text sets forth a detailed description of numerous different embodiments, it should be understood that the legal scope of the description is defined by the words of the claims set forth at the end of this disclosure. The Detailed Description is to be construed as exemplary only and does not describe every possible embodiment since describing every possible embodiment of the cassette handle would be impractical, if not impossible. Numerous alternative embodiments could be implemented, using either current technology or technology developed after the filing date of this patent, which would still fall within the scope of the claims. Additionally, any combination of features shown in the various figures can be used to create additional embodiments of the present disclosure. Thus, dimensions, aspects, and features of one embodiment of the cassette handle can be combined with dimensions, aspects, and features of another embodiment of the cassette handle to create the claimed embodiment.

In general, embodiments of the present disclosure are directed to a cassette handle, including for use with a cassette for semiconductor wafers or samples. The cassette handle includes a body, a first foot, and a second foot. When in a position following the application of a force to the body, the first foot and the second foot can engage a cassette for semiconductor wafers or samples. When in another position following the removal of the applied force, or absent an application of a force to the body, the first foot and the second foot are disengaged from the cassette.

Embodiments of the present disclosure are also directed to visual, aural, and/or tactile indicators that illustrate when the cassette handle is properly or corrected coupled to the cassette. Recesses and/or markers on the first foot and the second foot indicate when the first foot and the second foot are correctly engaged with the cassette. Where the cassette handle includes both recesses and markers, the markers may be inset within the recesses.

FIGS. 1A-1G in general illustrate a cassette handle 100, in accordance with one or more embodiments of the present disclosure.

The cassette handle 100 includes a first foot 102 coupled to a first leg 104 and a second foot 106 coupled to a second leg 108. In some embodiments, the foot 102 and the leg 104 are integrally formed as a single component, and/or the foot 106 and the leg 108 are integrally formed as a single component. In other embodiments, the foot 102 separately manufactured and coupled to the leg 104, and/or the foot 106 is separately manufactured and coupled to the leg 108. It is noted that the leg 104 may be considered a single component with the foot 102 (i.e., as the foot 102), and the leg 108 may be considered a single component with the foot 106 (i.e., as the foot 106), without departing from the scope of the present disclosure.

The foot 102 and/or the foot 106 includes one or more recesses 110 that each form a point of contact for a cassette, as discussed in detail further herein. In general, the feet 102, 106 may each include a set of recesses 110, where each set includes one or more recesses 110 (i.e., collectively, a plurality of recesses 110). It is noted that the recesses 110 may be considered grooves or channels, without departing from the scope of the present disclosure.

In some embodiments, the foot 102 and/or the foot 106 may include a main portion 112 with one or more flanges 114 that extend outward from the main portion 112 and include respective surfaces 116 with respective recesses 110. For instance, the foot 102 and/or the foot 106 may include two flanges 114, where each flange 114 includes a recess 110 within a surface 116. In general, the feet 102, 106 may each include a set of surfaces 116 (i.e., a surface 116 on each flange 114), where each set includes one or more surfaces 116 (i.e., collectively, a plurality of surfaces 116).

In embodiments, the recess 110 may be inset within only a portion of the surface 116. For example, the recess 110 may be inset within the surface 116 from a sidewall 118 to a point within the surface 116. It is noted that positioning the recess 110 to be in contact with the sidewall 118 may be beneficial where the cassette handle 100 couples to an exterior surface or edge of the cassette, as illustrated in detail further herein. Alternatively, the recess 110 may be inset within the entire surface 116 (i.e., from a sidewall 118 to a sidewall 120), or may be positioned to only be in contact with the sidewall 120 and to a point within the surface 116.

The recess 110 includes one or more markers 122. The markers 122 are positioned on (or formed as) a surface of the recess 110. The markers 122 may be a different color and/or texture from the recess 110. It is noted that the markers 122 may be one or multiple colors and/or textures, without departing from the scope of the present disclosure. For example, where the markers 122 include multiple colors and/or textures, each color and/or texture may be specific to a particular cassette (i.e., with different heights and/or different widths). It is noted that the feet 102, 106 may each include a set of markers 122, where each set includes one or more markers 122 (i.e., collectively, a plurality of markers 122).

The markers 122 may be fabricated as a layer of the feet 102, 106, or may be applied to a surface of the feet 102, 106 (i.e., as paint, as a sticker via an adhesive, via a manufacturing process including cutting, etching, or the like). It is noted, however, that the cassette handle 100 may only include the recess 110 for engaging with a cassette, and that the marker 122 may not be included, without departing from the scope of the present disclosure.

The feet 102, 106 are in communication with a body 124. For example, the feet 102, 106 are coupled to the body 124 via the respective legs 104, 108. In some configurations, the foot 102 is coupled to a first side of the body 124, and the foot 106 is coupled to a second side of the body 124 opposite the first side of the body 124 and across a longitudinal axis A.

In embodiments, the body 124 includes a first arm 126 and a second arm 128 in communication with a crossmember 130, that together form a cavity 132. For example, the first arm 126 is on a first side of the body 124, and the second arm 128 is on the second side of the body 124 opposite the first side of the body 124 and across the longitudinal axis A.

Optionally, the body 124 includes a head 134 that is in communication with the arms 126, 128, and additionally forms the cavity 132. For example, the head 134 may be in communication with the arms 126, 128 at a proximal end of the body 124 and the crossmember 130 may be in communication with the arms 126, 128 at a distal end of the body 124. In some embodiments, the head 134 includes one or more tabs 136 that extend from the head 134. For example, the one or more tabs 136 prevent the release of the cassette handle 100 by the operator, as the one or more tabs 136 may catch on the operator (i.e., when the cassette handle 100 slides in the grip of the operator). In general, the first arm 126, the second arm 128, the crossmember 130, and/or the head 134 may be considered components operable to be engaged by and/or receive a force from an operator.

The longitudinal axis A passes through the body 124 and the cavity 132, such that the crossmember 130 (and optionally the head 134) may bend via the application or removal of a force, to cause the feet 102, 106 to actuate away from or toward the longitudinal axis A. It is understood that the crossmember 130 and/or the head 134 may provide additional support to the body 124, and/or may operate as a living hinge for the cassette handle 100.

In some embodiments, the body 124 is an integrally formed as a single piece. Alternatively, the first arm 126, the second arm 128, the crossmember 130, and/or the head 134 may be separately manufactured and coupled together to form the body 124. In some embodiments, the body 124 and the legs 104, 108 are integrally formed as a single piece. Alternatively, the body 124, the first leg 104, and the second leg 108 may be separately manufactured and coupled together. It is noted that the arms 126, 128 may be in direct contact, such that there is no head 134 to the body 124, without departing from the scope of the present disclosure.

The crossmember 130 may be a first width 138, and the cavity 132 may have a second width 140 (i.e., between the arms 126, 128). For example, the second width 140 may be less than or equal to the first width 138. It is noted that at least the second width 140 may be different along the length of the cavity 132, depending on the shape or contouring of the arms 126, 128 along the length of the arms 126, 128. For example, the arm 126 and/or the arm 128 may include a respective bend 142 that assists in the operation of the crossmember 130 as a living hinge, as discussed in detail further herein, and/or reduces the second width 140 of the cavity 132 to provide additional comfort to an operator during use. In some instances, the inclusion of the bends 142 allows for a narrower cavity 132 to allow the arms 126, 128 to fit within an operator's grip closer to a proximal end of the arms 126, 128. In addition, the inclusion of the bends 142 increases the width 140 of the cavity 132 until the width 140 of the cavity 132 is approximately the width 138 of the crossmember 130 at a distal end of the arms 126, 128 where the crossmember 130 is in communication with the arms 126, 128.

It is noted that the first width 138 of the crossmember 130 may approximately equal to a width 144 of a cavity 146 defined between the leg 104 and the leg 108, without departing from the scope of the present disclosure.

FIGS. 2A-2F in general illustrate a cassette 200, in accordance with one or more embodiments of the present disclosure.

The cassette 200 includes a housing 202 with one or more slots 204 configured to receive and hold semiconductor wafers or samples. For example, the slots 204 may be spaced so as to allow a fluid used for a wet chemistry procedure to settle or flow around the semiconductor wafers or samples (i.e., when the cassette 200 is placed within a processing bath). In this regard, the cassette 200 may be considered a "semiconductor cassette" or a "bath cassette" or a "processing cassette" or a "wet chemistry procedure cassette," or the like.

The cassette 200 includes one or more rims 206 in communication with at least one of a first side 208, a second side 210, a first end 212, and a second end 214 of the housing 202. For example, the rims 206 may be integrally formed as a single piece with the housing 202. By way of another example, the rims 206 may be separately manufactured and coupled to the housing 202. In general, the cassette 200 may include one or more sets of rims 206, where each set includes one or more rims 206 (i.e., collectively, a plurality of rims 206).

The rim 206 includes one or more protrusions 216 that extend in a distal direction therefrom. The rim 206 may be positioned along the first side 208 (or the second side 210) and, as illustrated in FIGS. 2C and 2D, wrap around the first end 212 and the second end 214. In addition, the rim 206 may be positioned along the second side 210 and wrap around the first end 212 and the second end 214. The protrusion 216 that extends in a distal direction from the rim

206 is positioned on the portion of the rim 206 that is on the first end 212 and/or the second end 214. It is noted that the protrusion 216 may be fabricated as a portion of the rim 206, or may be attached to the rim 206 via one or more manufacturing processes. In general, the cassette 200 may include one or more sets of protrusions 216, where each set includes one or more protrusions 216 (i.e., collectively, a plurality of protrusions 216).

Figure 2A:
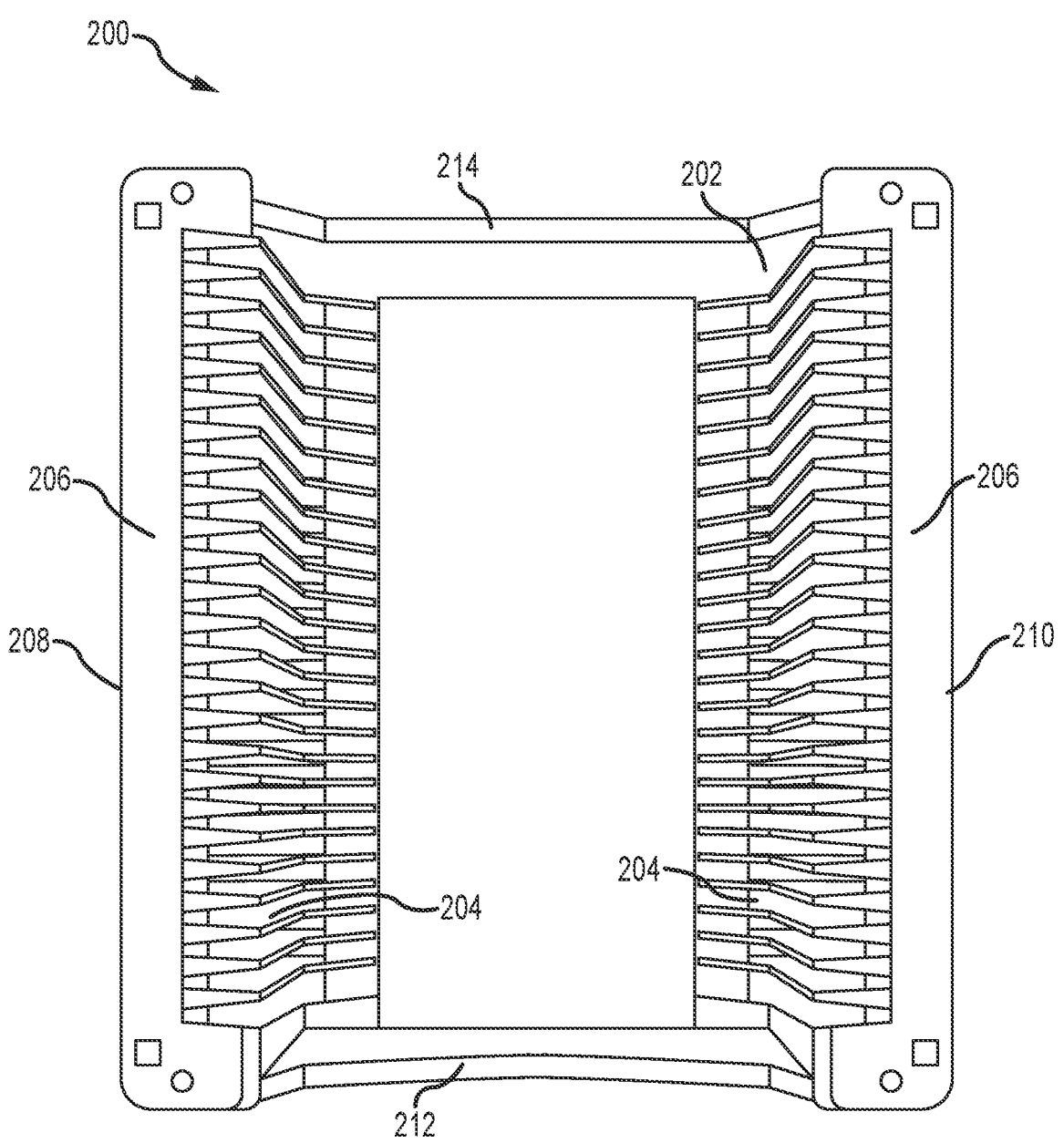
FIG. 2A illustrates a top plan view of a cassette, in accordance with one or more embodiments of the present disclosure.
Figure 2B:
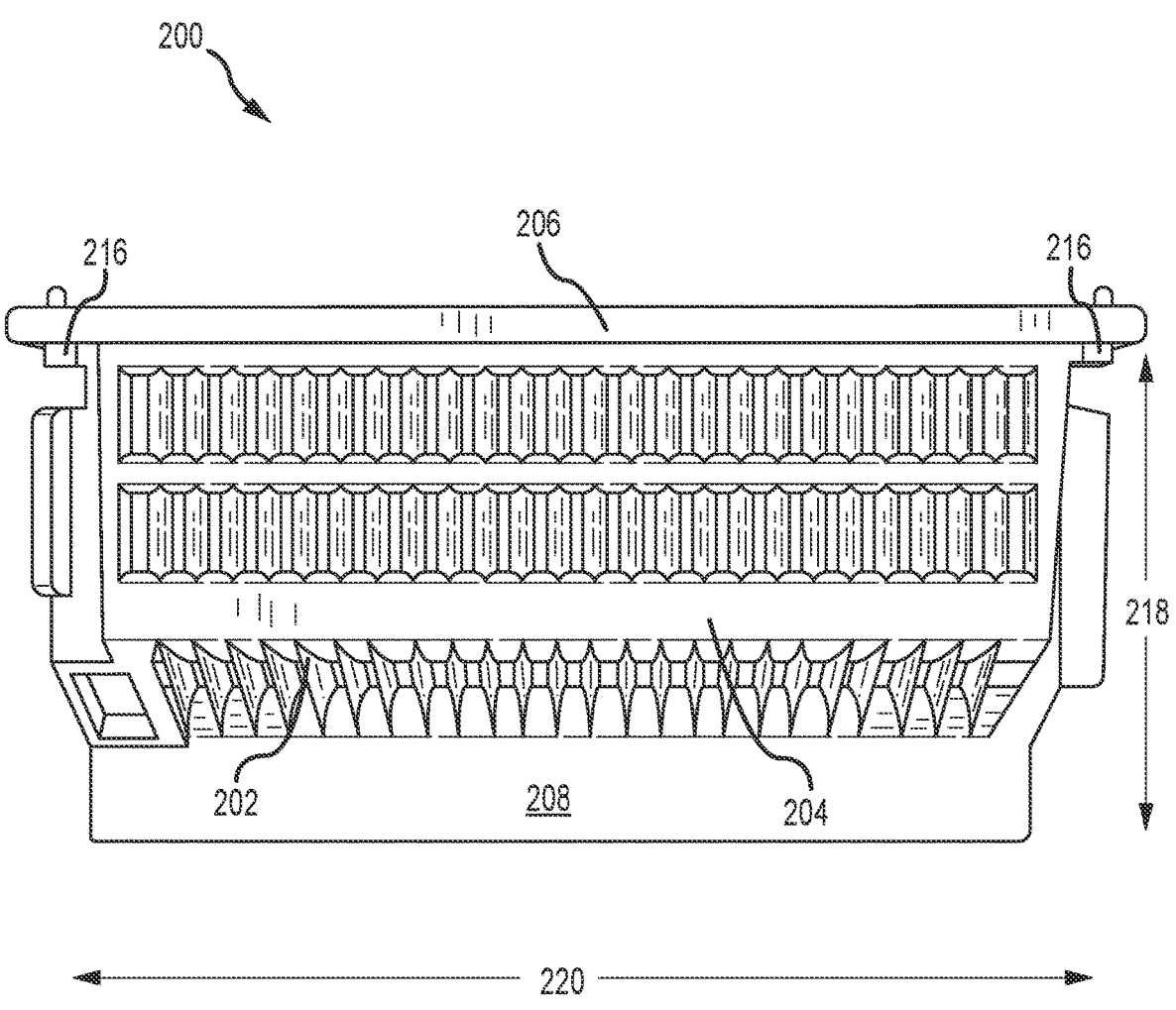
FIG. 2B illustrates a side elevation view of the cassette of FIG. 2A.
Figure 2C:
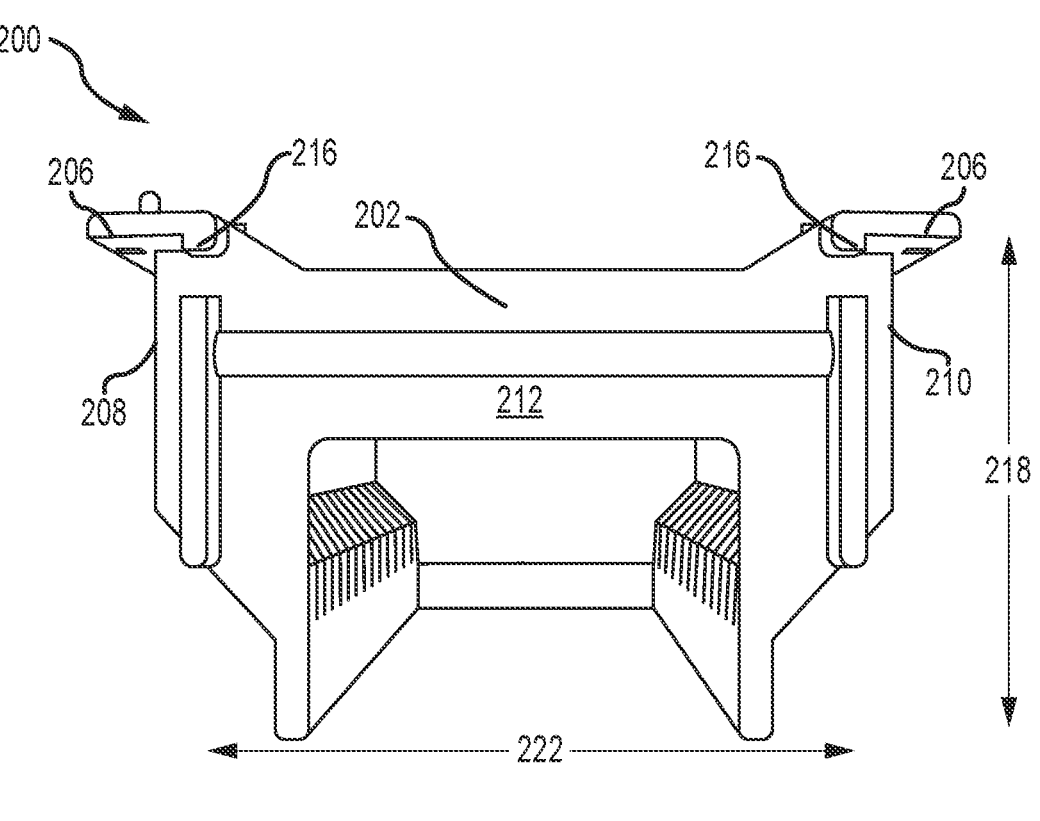
FIG. 2C illustrates a front elevation view of the cassette of FIG. 2A.
Figure 2D:
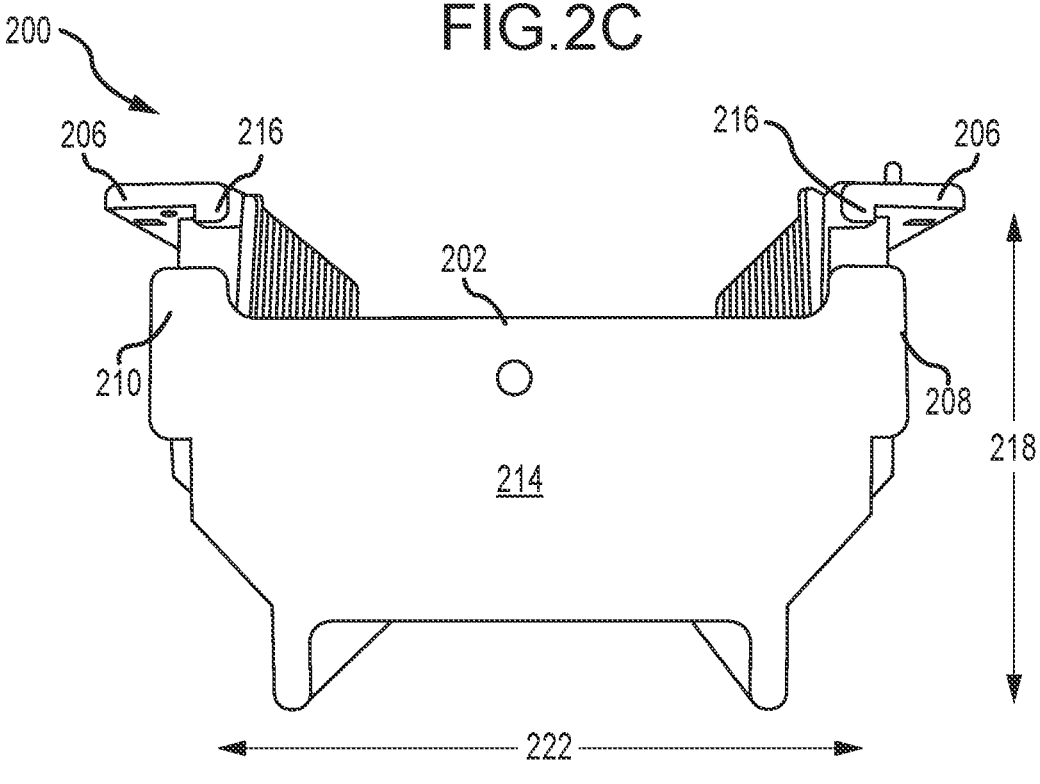
FIG. 2D illustrates a rear elevation view of the cassette of FIG. 2A.
Figure 2E:
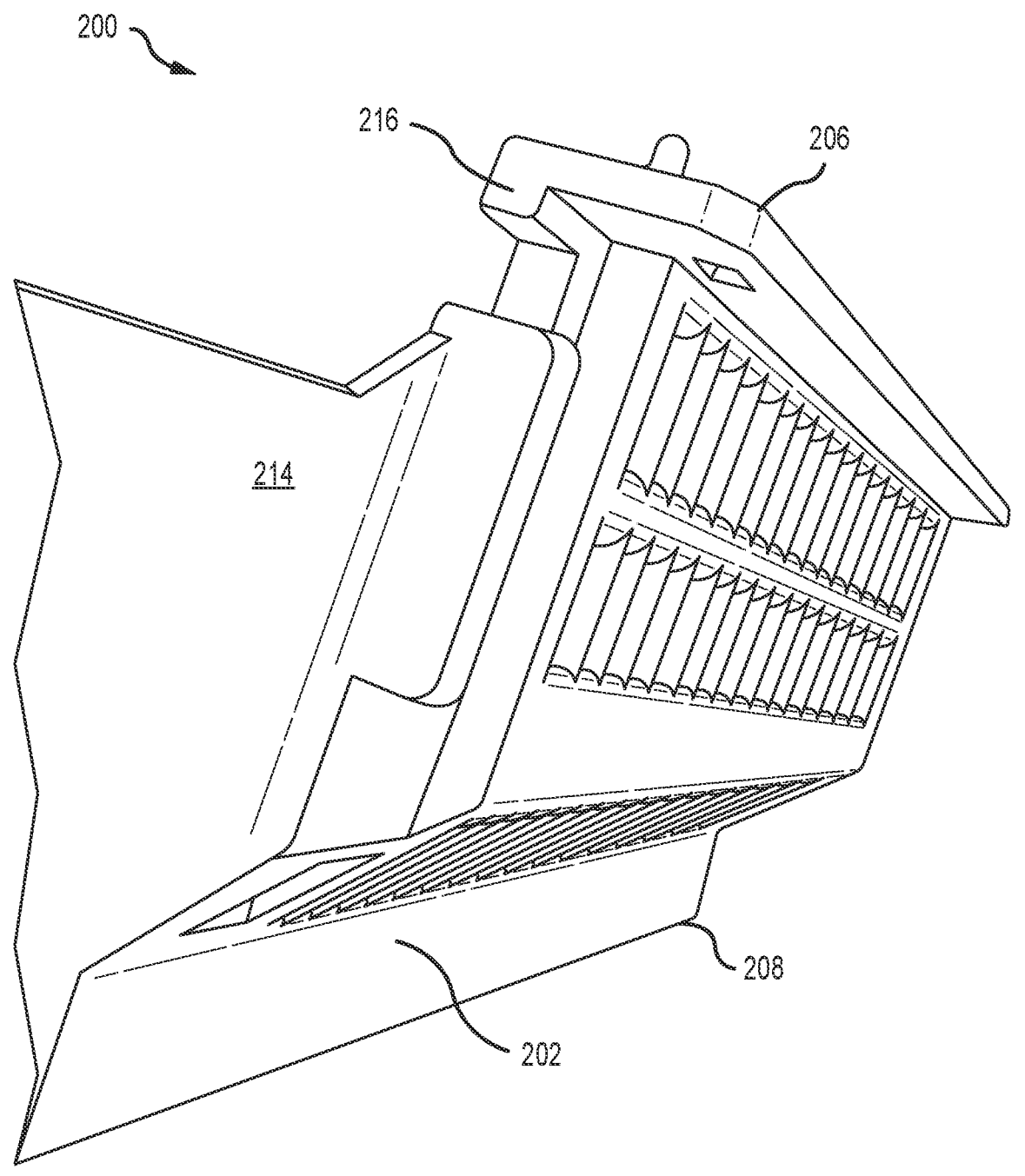
FIG. 2E illustrates a perspective view of a portion of the cassette of FIG. 2A.
Figure 2F:
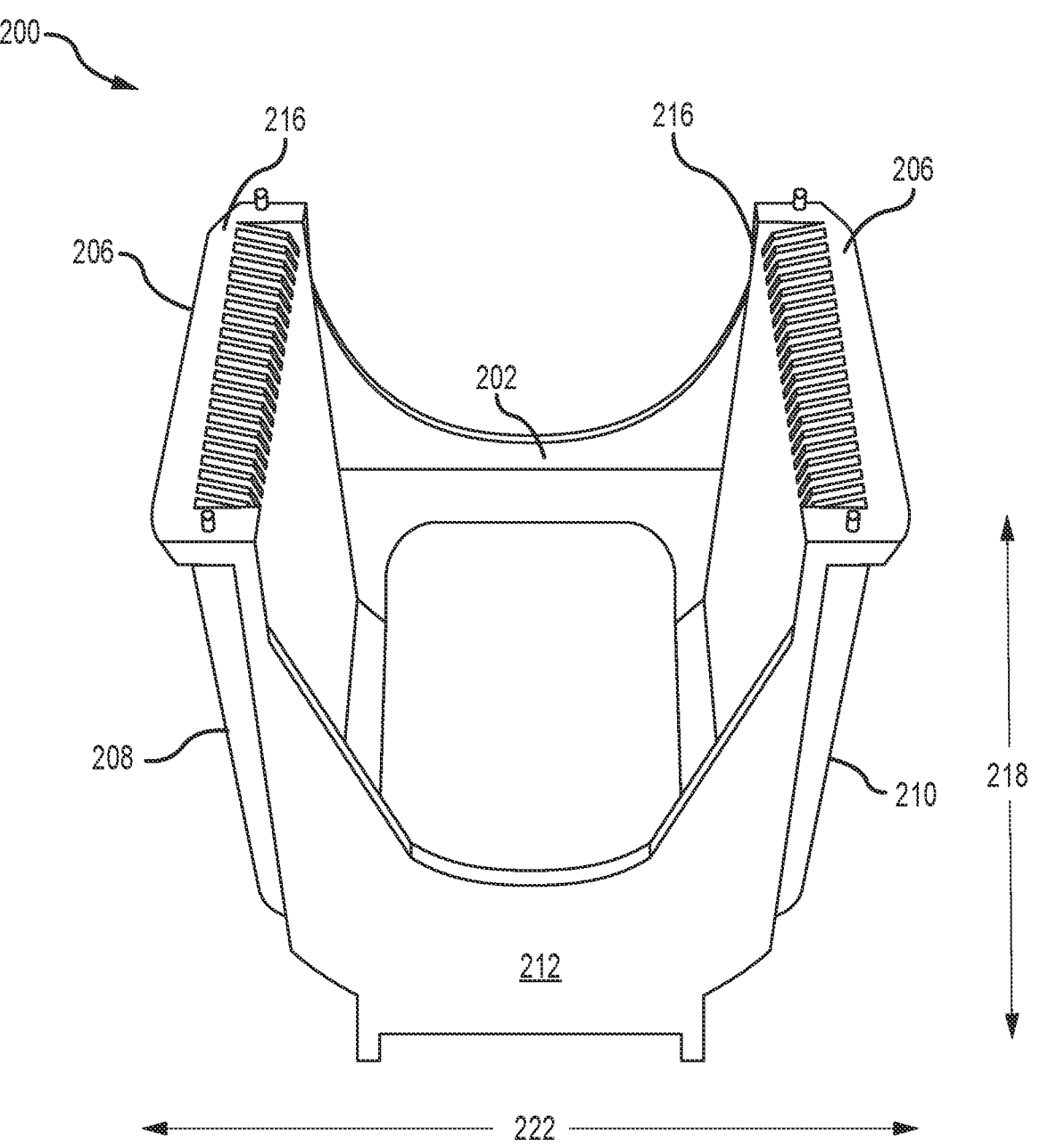
FIG. 2F illustrates a variation of the cassette of FIG. 2A.

As illustrated in a comparison of FIGS. 2B and 2C/2D versus 2F, the cassette 200 may be any height 218, so long as a length 220 and a width 222 of the cassette 200 is such that the protrusions 216 on the one or more rims 206 are in a position that would correspond to the recesses 110 of the cassette handle 100. For example, the length 220 of the cassette 200 may be approximately the same as the width 144 between the legs 104, 108 of the cassette handle 100, regardless of the height 218 of the cassette 200.

FIG. 3A-3E in general illustrate a system 300, in accordance with one or more embodiments of the present disclosure. The system 300 includes the cassette handle 100 and the cassette 200.

To couple the cassette handle 100 to the cassette 200, the operator can engage with the body 124 of the cassette handle 100. For example, the operator may enclose the arms 126, 128 of the body 124, and apply a force (i.e., a gripping force or a squeezing force) to the arms 126, 128.

The force applied to the arms 126, 128 may transfer through the crossmember 130 to the legs 104, 108 and corresponding feet 102, 106. For example, the force may cause the crossmember 130 to bend as a living hinge, becoming concave relative to the cavity 132 defined within the body 124. By way of another example, the force may cause the head 134 to bend as a living hinge, becoming concave relative to the cavity 132 defined within the body 124. The bending of the crossmember 130 (and optionally the head 134) via the application of force to the arms 126, 128 causes the distance or width 144 between the feet 102, 106 to increase, as the feet 102, 106 actuate outward away from the longitudinal axis A through the cassette handle 100.

Once the width 144 between the feet 102, 106 has increased to be greater than the length 220 of the cassette 200, the cassette handle 100 may be positioned around the cassette 200 such that the recesses 110 on the feet 102, 106 are in proximity to respective protrusions 216 of the cassette 200. For example, the foot 102 may be positioned about the cassette 200 such that the recesses 110 can receive the protrusions 216 on the end 212, and the foot 106 may be positioned about the cassette 200 such that the recesses 110 can receive the protrusions 216 on the end 214, or vice versa. It is noted that the width 144 between the feet 102, 106 need only to be increased to, but is not limited to, a length greater than a distance between the protrusions 216 and rims 206, to allow the sidewalls 118 of the feet 102, 106 to clear the rims 206 and to positions the recesses 110 proximal to the protrusions 216.

Removal of the applied force (or releasing of the applied force) causes the width 144 between the feet 102, 106 to decrease, as the feet 102, 106 each actuate toward the longitudinal axis A through the cassette handle 100. This causes the protrusions 216 of the cassette 200 to rest within the recesses 110, securing the cassette 200 to the cassette handle 100. Optionally, the sidewalls 118 of the feet 102, 106 may additionally be in contact with respective sidewalls 302, 304 of the ends 212, 214.

Figure 3A:
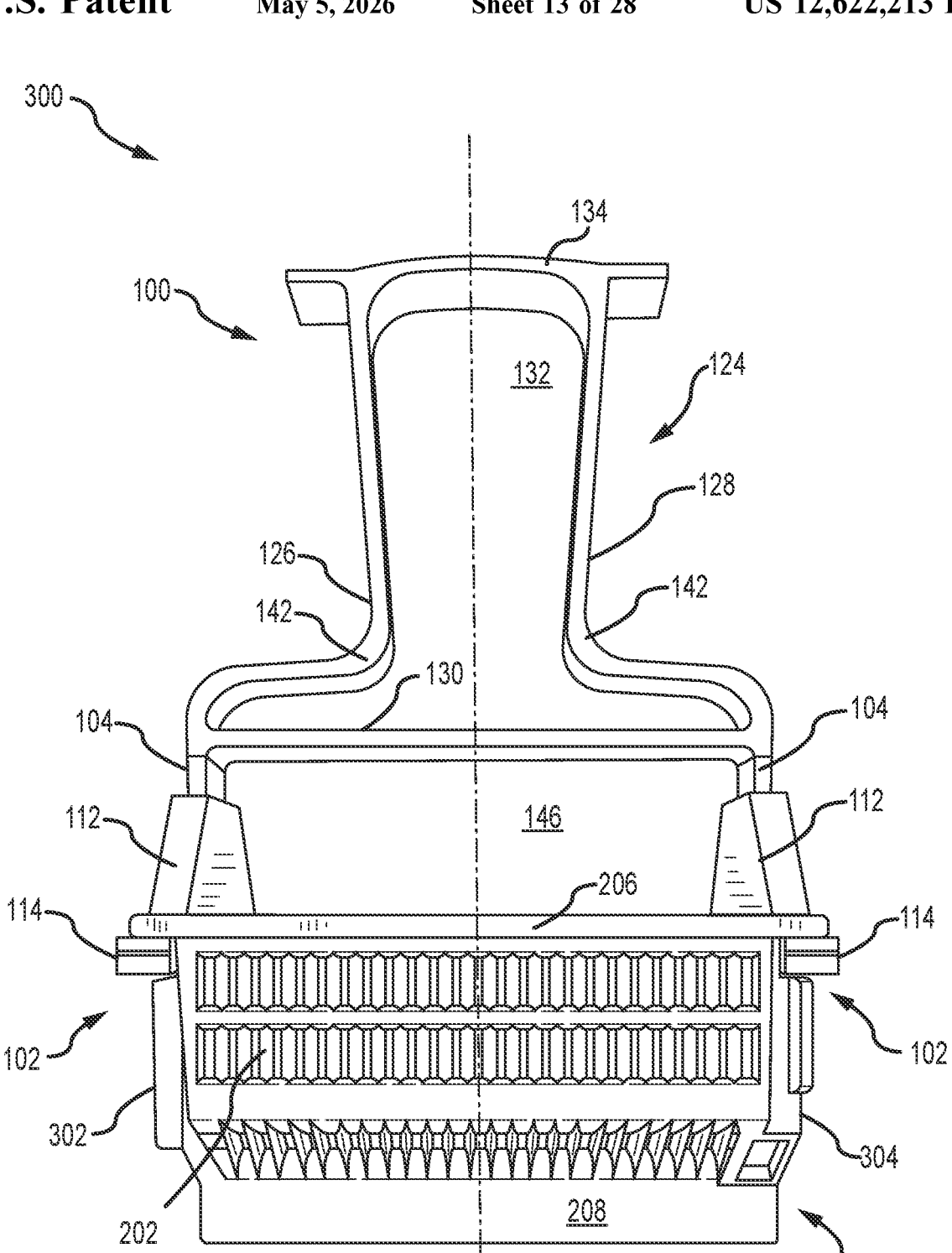
FIG. 3A illustrates a side elevation view of a system including the cassette handle of FIG. 1A and the cassette of FIG. 2A, in accordance with one or more embodiments of the present disclosure.
Figure 3B:
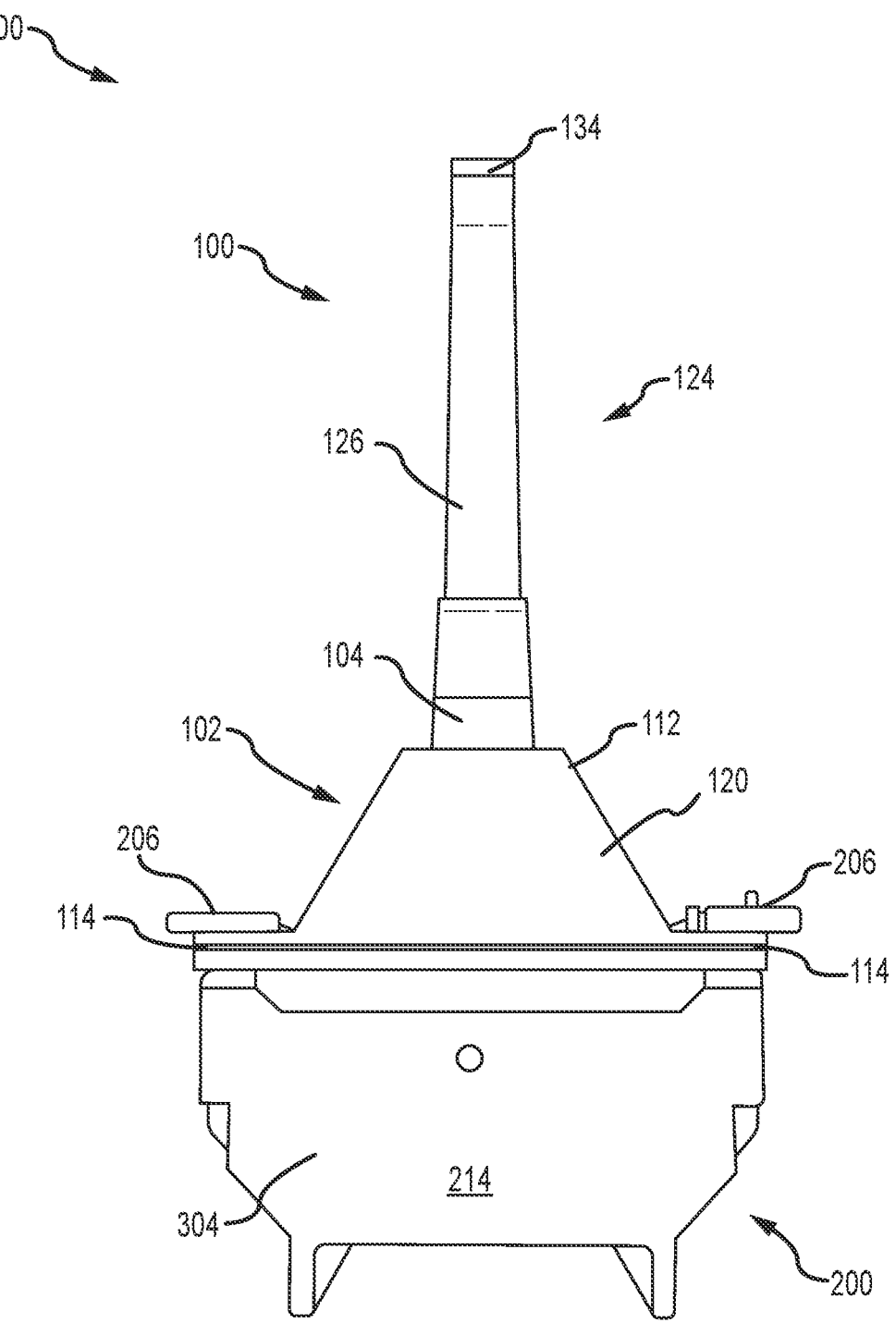
FIG. 3B illustrates a front elevation view of the system of FIG. 3A.
Figure 3C:
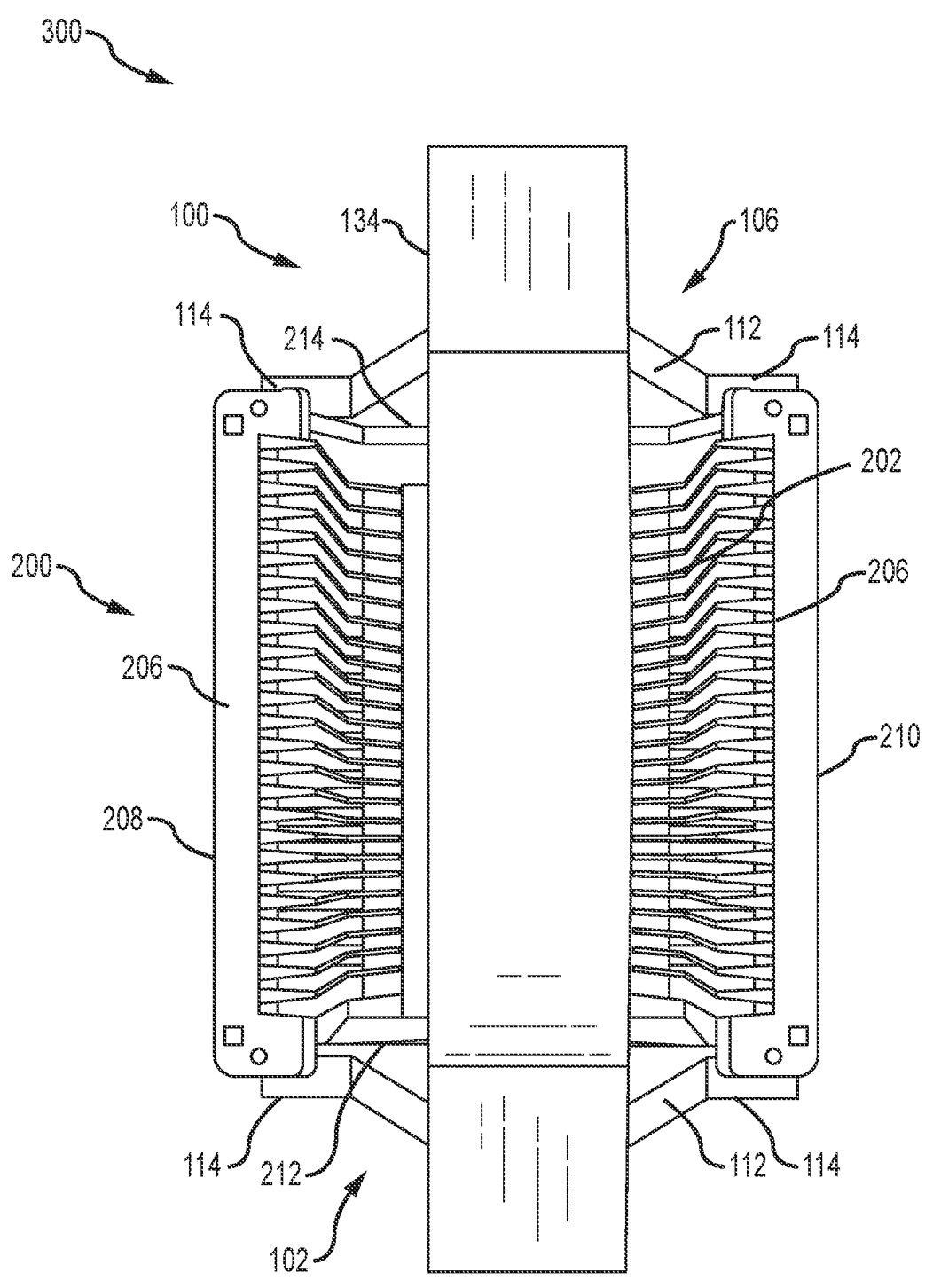
FIG. 3C illustrates a top plan view of the system of FIG. 3A.

As illustrated in FIG. 3C, as the recesses 110 only extend partway into the flanges 114 from the sidewalls 118 in some embodiments, the recesses 110 can only receive the protrusions 216 of the cassette by actuating toward the protrusions in a direction that originates outward from the cassette 200 relative to the longitudinal axis A through the body 124. This creates an additional level of security between the cassette handle 100 and the cassette 200.

Figures 3D, 3E:
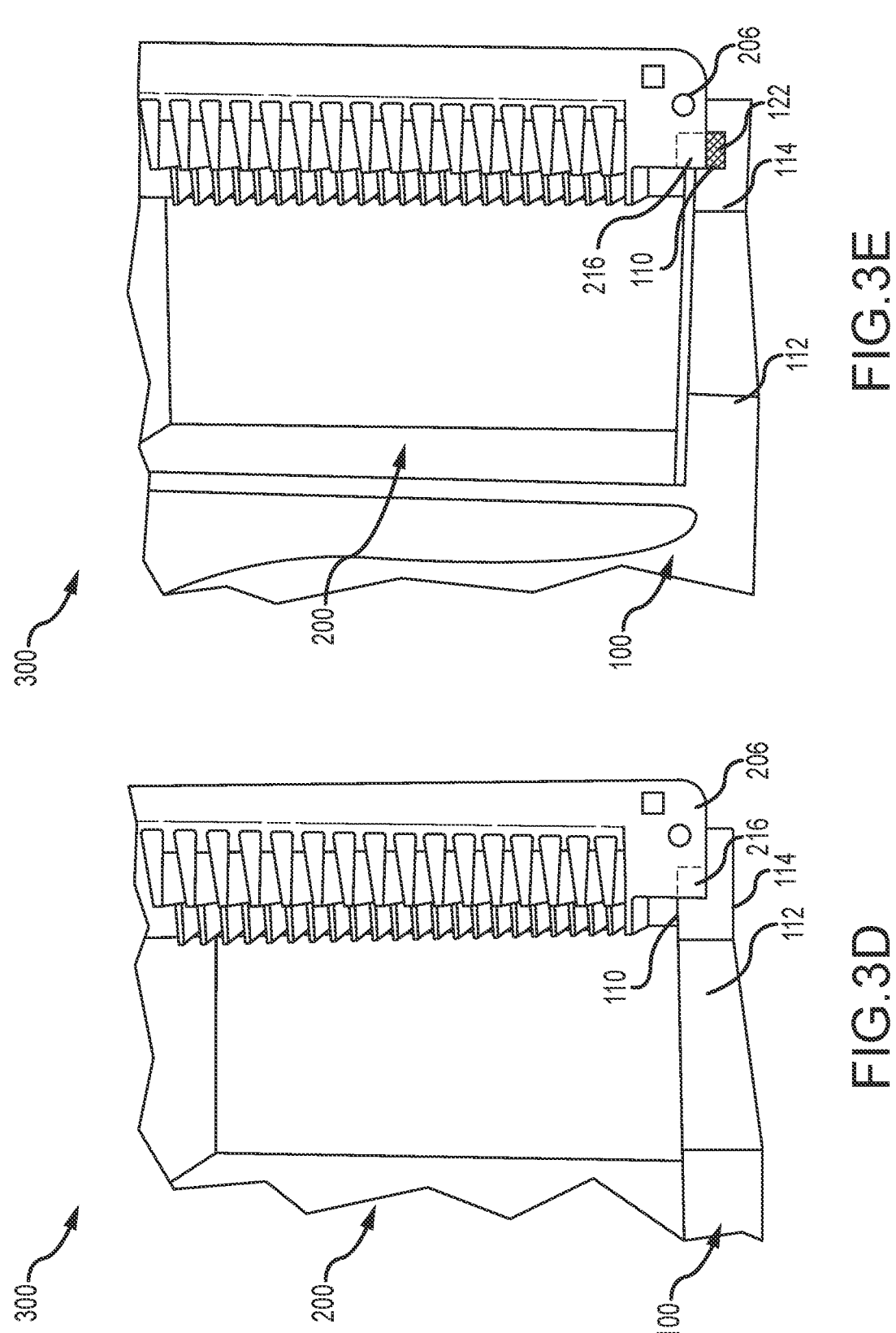
FIG. 3D illustrates a portion of the system of FIG. 3A, where the foot of the cassette handle is engaged with the cassette.
FIG. 3E illustrates the portion of the system of FIG. 3D, where the foot of the cassette handle is disengaged from the cassette.
Figure 4A:
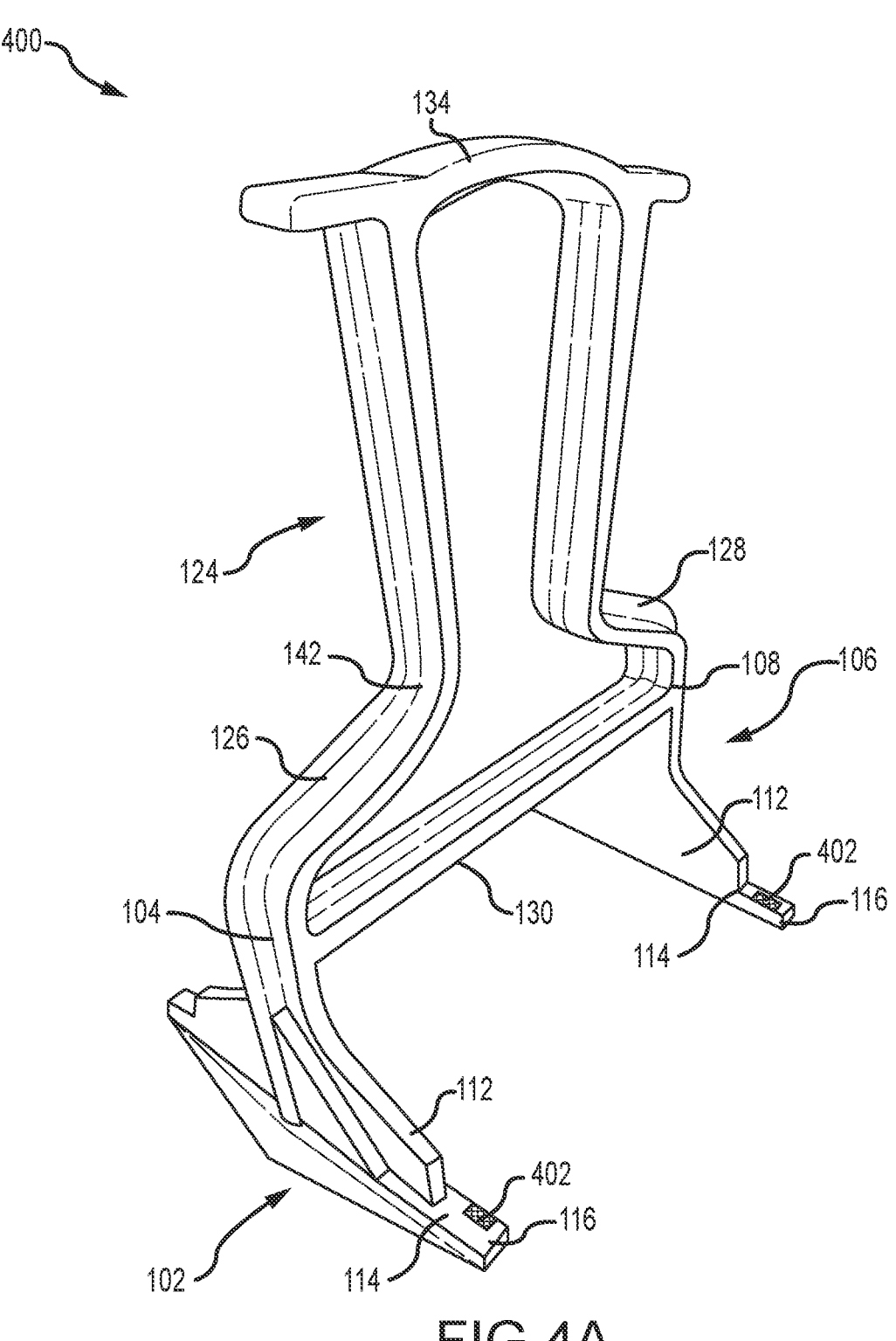
FIG. 4A illustrates a perspective view of a variation of the cassette handle of FIG. 1A, in accordance with one or more embodiments of the present disclosure.
Figure 4B:
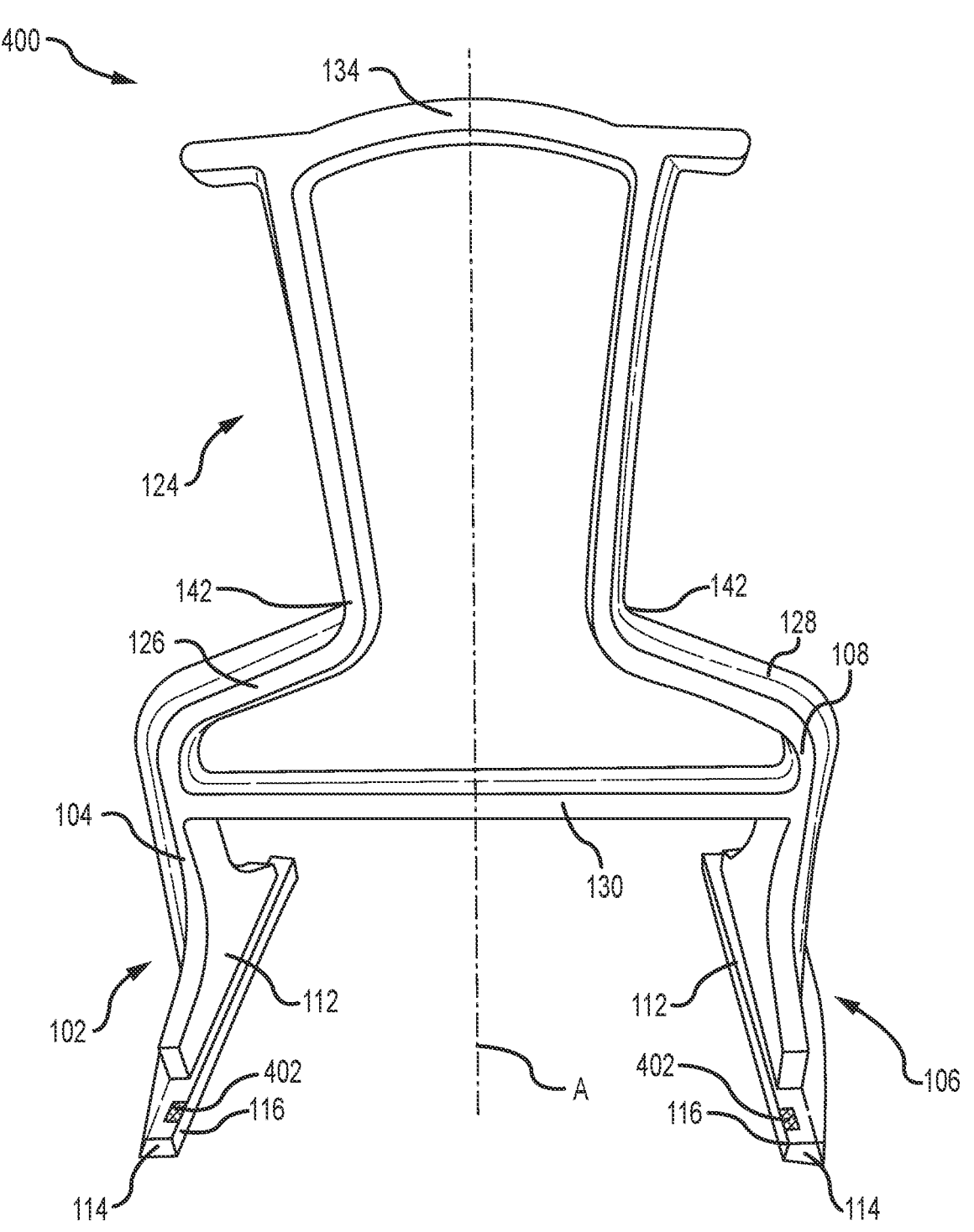
FIG. 4B illustrates a front elevation view of the variation of the cassette handle of FIG. 4A.
Figure 4C:
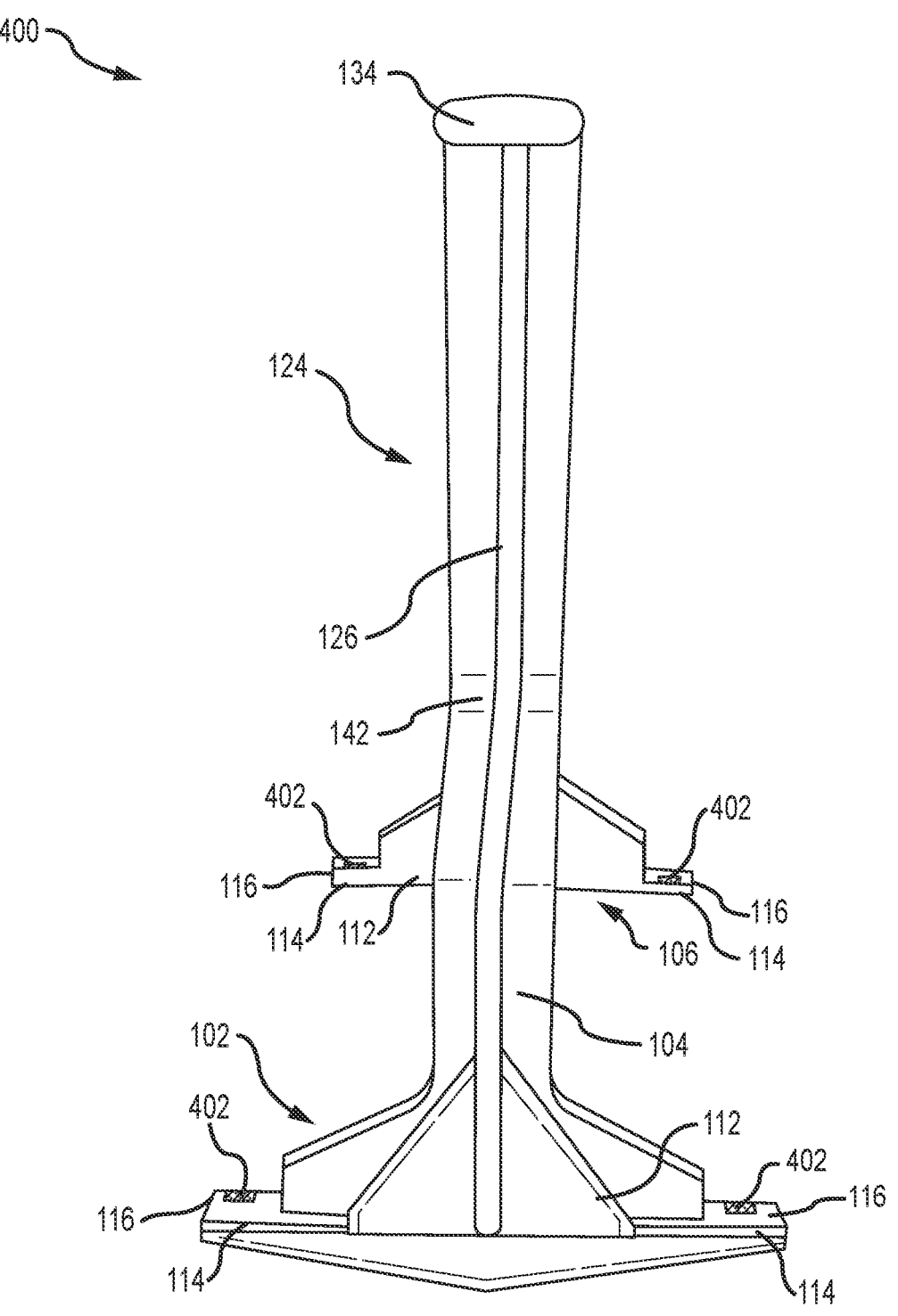
FIG. 4C illustrates a side elevation view of the variation of the cassette handle of FIG. 4A.
Figure 4D:
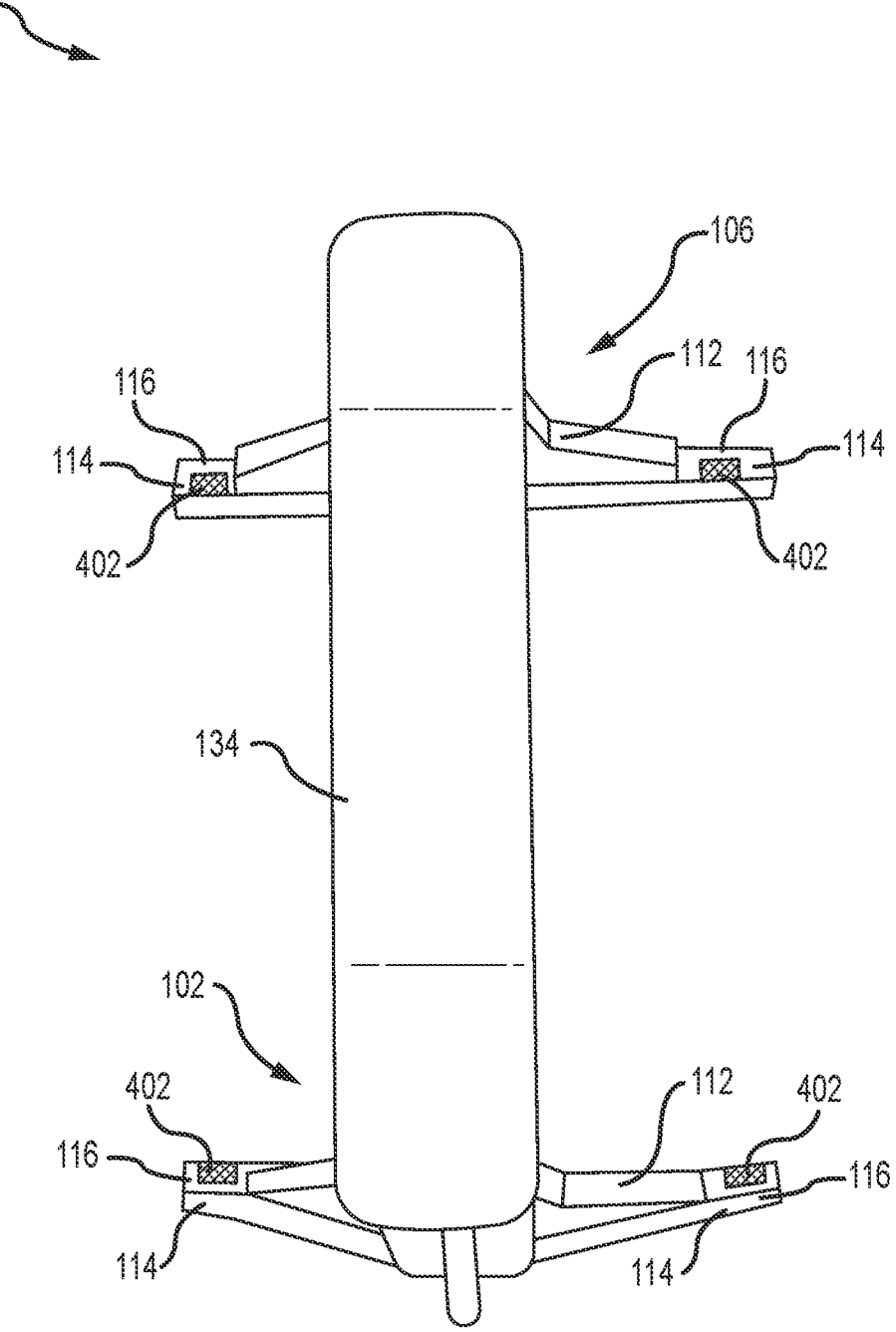
FIG. 4D illustrates a top plan view of the variation of the cassette handle of FIG. 4A.

As illustrated in a comparison between FIGS. 3D and 3E, engaging the cassette 200 with the cassette handle 100 causes there to be an illustrative distinction between when the cassette handle 100 is engaged and when the cassette handle 100 is disengaged. For example, FIG. 3D illustrates the cassette 200 being properly seated within the cassette handle 100, such that the recess 110 and/or the markers 122 on the cassette handle 100 are not visible or are covered by the protrusions 216 of the cassette 200. Alternatively, FIG. 3E illustrates the cassette 200 being improperly seated within the cassette handle 100, such that there is recess 110 and/or the markers 122 on the cassette handle 100 that are visible around the protrusions 216 of the cassette 200. It is noted that the protrusions 216 are shown FIGS. 3D and 3E in broken line form through the flange 114 for purposes of clarity only.

Thus, the recesses 110 and/or the markers 122 serve as visual indicators that the cassette handle 100 is connected to the cassette 200. The recesses 110 and/or the markers 122 may be a different color and/or texture from the cassette 200. It is noted that the recesses 110 and/or the markers 122 may be one or multiple colors and/or textures, without departing from the scope of the present disclosure. For example, where a recess 110 and/or a marker 122 includes multiple colors and/or textures, each color and/or texture may be specific to a particular cassette 200 (i.e., with different heights and/or different widths).

In addition, or in the alternative where the recesses 110 do not include markers 122 of a different color and/or texture, the engaging of the recesses 110 of the protrusions 216 may serve as aural and/or tactile indicators that the cassette handle 100 is connected to the cassette 200. For example, the engaging of the recesses 110 to the protrusions 216 may be accompanied by a sound including, but not limited to, clicking, snapping, or the like. By way of another example, the engaging of the recesses 110 to the protrusions 216 may be observed via touch through the body 124.

It is noted that the operator may be a human operator who engages the body 124 with their hand. In addition, it is noted that the operator may be an automated or robotic, which engages the body 124 with a gripper and includes the necessary sensors (e.g., optical, sound, touch, or the like) to observe the visual, aural, and/or tactile indicators as described herein. In this regard, it should be understood that the system 300 may include the necessary hardware components and/or software components (i.e., for robotics and/ or for a computer including a processor and memory to operate the robotics and analyze data from the robotics) to manipulate the cassette handle 100, without departing from the scope of the present disclosure. In addition, it should be understood that the cassette handle 100 may be a component of the robotics portion of the system 300, without departing from the scope of the present disclosure.

FIGS. 4A-4D in general illustrate a cassette handle 400, in accordance with one or more embodiments of the present disclosure. It is noted that embodiments or aspects directed to the cassette handle 100 of FIGS. 1A-1G, and the engagement of the cassette handle 100 to the cassette 200 within the system 300 of FIGS. 3A-3E, may be directed to the cassette handle 400 of FIGS. 4A-4D unless specifically noted, and vice versa, without departing from the scope of the present disclosure.

In FIGS. 4A-4D, the flanges 114 of the feet 102, 106 do not have the recesses 110. Rather, one or more markers 402 are positioned on the surfaces 116 of the flanges 114. This provides a benefit of reducing the manufacturing time and cost of the cassette handle 400, by not having to fabricate the recesses 110.

The markers 402 are positioned on (or formed as part of) the surface 116. The markers 402 may be a different color and/or texture from the surface 116. It is noted that the markers 402 may be one or multiple colors and/or textures, without departing from the scope of the present disclosure. For example, where the markers 402 include multiple colors and/or textures, each color and/or texture may be specific to a particular cassette (i.e., with different heights and/or different widths). It is noted that the feet 102, 106 may each include a set of markers 402, where each set includes one or more markers 402 (i.e., collectively, a plurality of markers 402).

Although not shown, it should be understood that the cassette handle 400 can couple to the cassette 200. For example, the markers 402 are not visible or are covered when the feet 102, 106 engage the cassette 200. By way of another example, the markers 402 are visible when the feet 102, 106 disengage from the cassette 200. Thus, the markers 402 serve as visual indicators that the cassette handle 400 is connected to the cassette 200.

Figure 5:
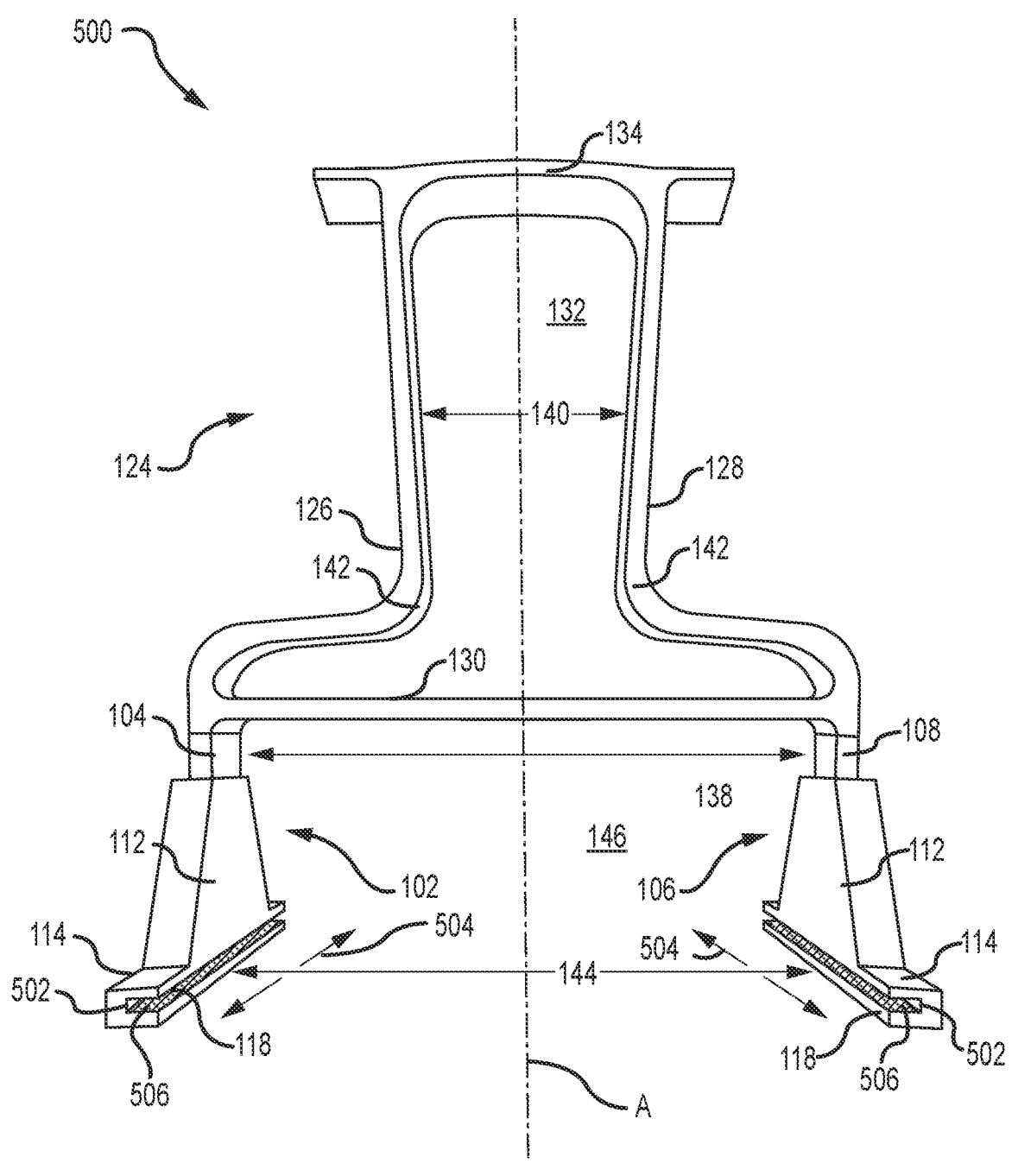
FIG. 5 illustrates a variation of the cassette handle of FIG. 1A.

FIG. 5 illustrates a cassette handle 500, in accordance with one or more embodiments of the present disclosure. It is noted that embodiments or aspects directed to the cassette handle 100 of FIGS. 1A-1G, and the engagement of the cassette handle 100 to the cassette 200 within the system 300 of FIGS. 3A-3E, may be directed to the cassette handle 500 of FIG. 5 unless specifically noted, and vice versa, without departing from the scope of the present disclosure.

In FIG. 5, the feet 102, 106 include a recess 502 that extends into the feet 102, 106 from the sidewall 118. For example, the recess 502 may extend the entire length 504 of the feet 102, 106. By way of another example, each foot 102 and/or 106 may have multiple recesses 502 that are not connected. In general, the feet 102, 106 may each include a set of recesses 502, where each set includes one or more recesses 502 (i.e., collectively, a plurality of recesses 502). It is noted that the recesses 502 may be considered grooves or channels, without departing from the scope of the present disclosure.

The recesses 502 can optionally include a marker 506. The marker 506 is positioned on (or formed as) a surface of the recess 502. The marker 506 may be a different color and/or texture from the recess 502. It is noted that the marker 506 may be one or multiple colors and/or textures, without departing from the scope of the present disclosure. For example, where the marker 506 includes multiple colors and/or textures, each color and/or texture may be specific to a particular cassette (i.e., with different heights and/or different widths). It is noted that the feet 102, 106 may each include a set of markers 506, where each set includes one or more markers 506 (i.e., collectively, a plurality of markers 506).

It is noted, however, that the cassette handle 500 may only include the recess 502 for engaging with a cassette, and that the markers 506 may not be included, without departing from the scope of the present disclosure.

Although not shown, it should be understood that the cassette handle 500 can couple to the cassette 200. For example, the recess 502 may be configured to receive the rim 206 of the cassette 200. Where the markers 506 are within the recess 502, the markers 506 are not visible or are covered when the feet 102, 106 engage the cassette 200. Where the markers 506 are within the recess 502, the markers 506 are visible when the feet 102, 106 disengage from the cassette 200. Thus, the recesses 502 and/or the markers 506 serve as visual indicators that the cassette handle 500 is connected to the cassette 200. In addition, or in the alternative where the recesses 502 do not include markers 506 of a different color and/or texture, the engaging of the recesses 502 of the rims 206 may serve as aural and/or tactile indicators that the cassette handle 500 is connected to the cassette 200.

Although not shown, it should be understood that the various indicators of the cassette handles 100, 400, 500 are combinable, without departing from the scope of the present disclosure. For example, the cassette handle 100 and/or the cassette handle 500 may include the recesses 502 (with optional markers 506), and additionally include the recesses 110 (with optional markers 122) that may or not may pass through the feet 102, 106 to join the respective recesses 502. By way of another example, the cassette handle 400 and/or the cassette handle 500 may include the recesses 502 (with optional markers 506), and additionally include the markers 402 on the top surface 116 of the feet 102, 106.

FIG. 6A is a method or process flow diagram 600 illustrating the operation of the cassette handles described with one or more embodiments or the present disclosure. While a general order for the steps of the method or process is shown in FIG. 6A, the method or process can include more or fewer steps or can arrange the order of the steps differently (including simultaneously, substantially simultaneously, or sequentially) than those shown in FIG. 6A. It is noted that the method or process shall be explained with reference to the components, devices, subassemblies, environments, etc. described in conjunction with FIGS. 1A-5. For example, it is noted that the embodiments as illustrated in FIGS. 1A-5 should be understood as reading on the embodiments described with respect to FIG. 6A, and vice versa, without departing from the scope of the present disclosure.

In a step 602, a force is applied to the cassette handle. The cassette handle 100, 400, 500 includes a body 124 and feet 102, 106. Application of a force to the body 124 (i.e., to arms 126, 128) causes a crossmember 130 (and optionally, a head 134) of the body 124 to flex, increasing a width 144 between the feet 102, 106 of the cassette handle 100.

In a step 604, the cassette handle is positioned proximate to a cassette. While the width 144 between the feet 102, 106 is increased due to the applied force, the feet 102, 106 are positioned proximate to rims 206 including protrusions 216 of the cassette 200.

In a step 606, the force is removed from the cassette handle. Removal of the force causes the width 144 between the feet 102, 106 to decrease.

In a step 608, the cassette handle engages the cassette. The feet 102, 106 of the cassette handle 100, 400, 500 include respective recesses 110 with optional markers 122, markers 402, and recesses 502 with optional markers 506. When the width 144 decreases due to the removal of the force, the feet 102, 106 engage the protrusions 216 and/or the rims 206 of the cassette 200 with the respective recesses 110 with optional markers 122, markers 402, and recesses 502 with optional markers 506 of the cassette handle 100, 400, 500. Engagement of the protrusions 216 and/or the rims 206 of the cassette 200 with the respective recesses 110 with optional markers 122, markers 402, and recesses 502 with optional markers 506 of the cassette handle 100, 400, 500 creates a visual indication of coupling by covering up the markers 122, 402, 506. Alternatively or in addition, engagement of the protrusions 216 and/or the rims 206 of the cassette 200 with the respective recesses 110 with optional markers 122, markers 402, and recesses 502 with optional markers 506 of the cassette handle 100, 400, 500 creates an aural indication of coupling with sound and/or a tactile indication of coupling with touch.

It is noted that process 600 may be utilized to place the cassette 200 within a processing bath or to remove the cassette 200 from the processing bath with the cassette handle 100, 400, 500, without departing from the scope of the present disclosure.

FIG. 6B is a method or process flow diagram 610 illustrating the operation of the cassette handles described with one or more embodiments or the present disclosure. While a general order for the steps of the method or process is shown in FIG. 6B, the method or process can include more or fewer steps or can arrange the order of the steps differently (including simultaneously, substantially simultaneously, or sequentially) than those shown in FIG. 6B. It is noted that the method or process shall be explained with reference to the components, devices, subassemblies, environments, etc. described in conjunction with FIGS. 1A-5. For example, it is noted that the embodiments as illustrated in FIGS. 1A-5 should be understood as reading on the embodiments described with respect to FIG. 6B, and vice versa, without departing from the scope of the present disclosure.

In a step 612, a force is applied to the cassette handle. The cassette handle 100, 400, 500 includes a body 124 and feet 102, 106. Application of a force to the body 124 (i.e., to arms 126, 128) causes a crossmember 130 (and optionally, a head 134) of the body 124 to flex, increasing a width the between feet 102, 106 of the cassette handle 100.

In a step 614, the cassette handle disengages a cassette. The feet 102, 106 of the cassette handle 100, 400, 500 include respective recesses 110 with optional markers 122, markers 402, and recesses 502 with optional markers 506. When the width 144 increases due to the application of the force, the feet 102, 106 disengage from the protrusions 216 and/or the rims 206 of the cassette 200 with the respective recesses 110 with optional markers 122, markers 402, and recesses 502 with optional markers 506 of the cassette handle 100, 400, 500. Disengagement of the protrusions 216 and/or the rims 206 of the cassette 200 with the respective recesses 110 with optional markers 122, markers 402, and recesses 502 with optional markers 506 of the cassette handle 100, 400, 500 creates a visual indication of uncoupling by showing the markers 122, 402, 506. Alternatively or in addition, disengagement of the protrusions 216 and/or the rims 206 of the cassette 200 with the respective recesses 110 with optional markers 122, markers 402, and recesses 502 with optional markers 506 of the cassette handle 100, 400, 500 creates an aural indication of uncoupling with sound and/or a tactile indication of uncoupling with touch.

In a step 616, the cassette handle is removed from a position proximate to the cassette. While the width 144 between the feet 102, 106 is increased due to the applied force, the feet 102, 106 are removed from the position proximate to the rims 206 including the protrusions 216 of the cassette 200.

In a step 618, the force is removed from the cassette handle. Removal of the force causes the width 144 between the feet 102, 106 to decrease.

It is noted that process 610 may be utilized to place the cassette 200 within a processing bath or to remove the cassette 200 from the processing bath with the cassette handle 100, 400, 500, without departing from the scope of the present disclosure.

FIGS. 7A-7F in general illustrate the operation of the cassette handles 100, 400, 500, in accordance with one or more embodiments or the present disclosure. Although FIGS. 7A-7F illustrates the cassette handle 100, it should be understood that the cassette handles 400, 500 may be similarly operated, without departing from the scope of the present disclosure. In addition, it should be understood that one or more of the steps of the processes 600, 610 as described herein may be understood as being illustrated in FIGS. 7A-7F.

Figure 7A:
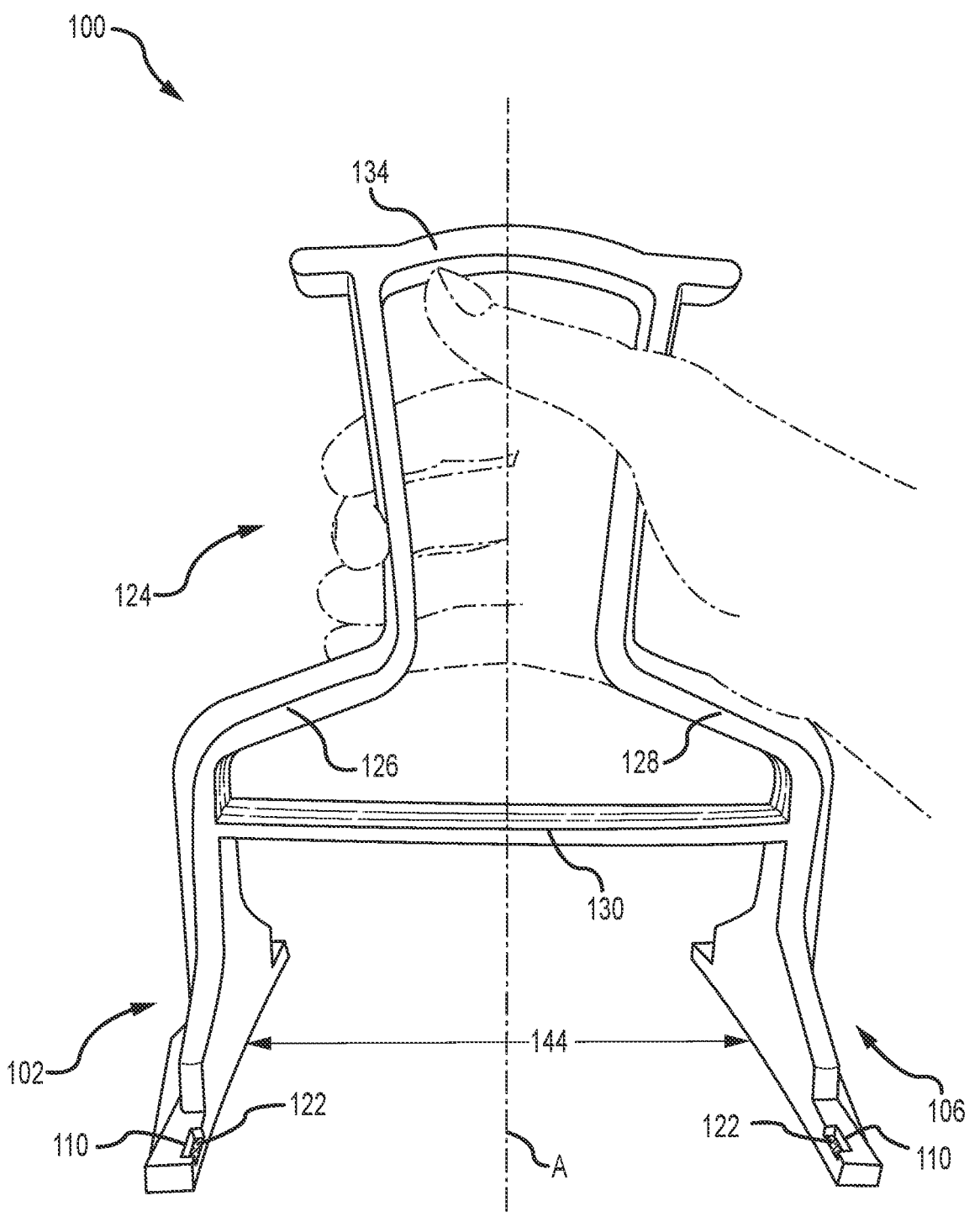
FIG. 7A illustrates the cassette handle of FIG. 1A in a rest position, in accordance with one or more embodiments.
Figure 7B:
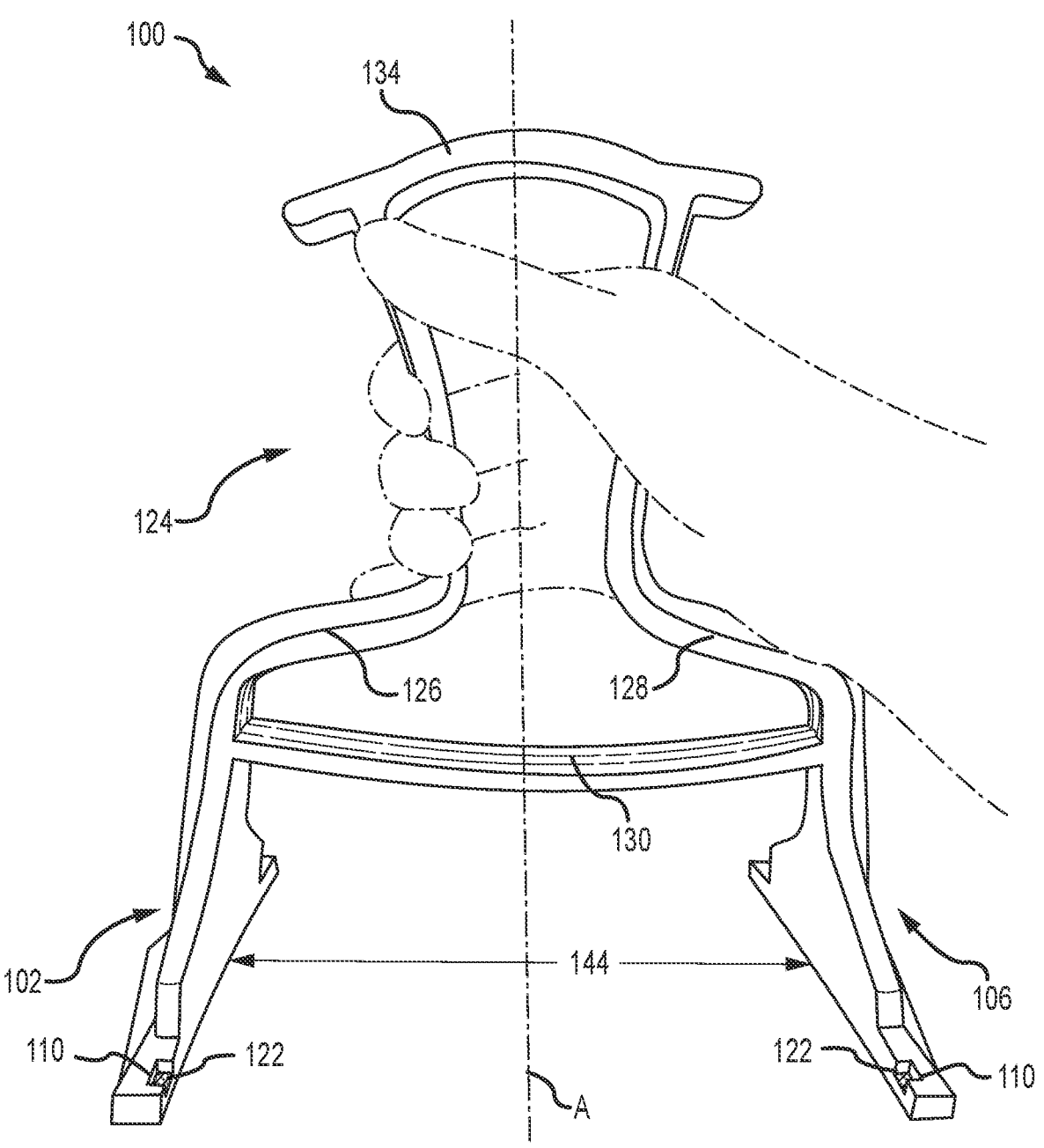
FIG. 7B illustrates the cassette handle of FIG. 7A in an open position following the application of a force.
Figure 7C:
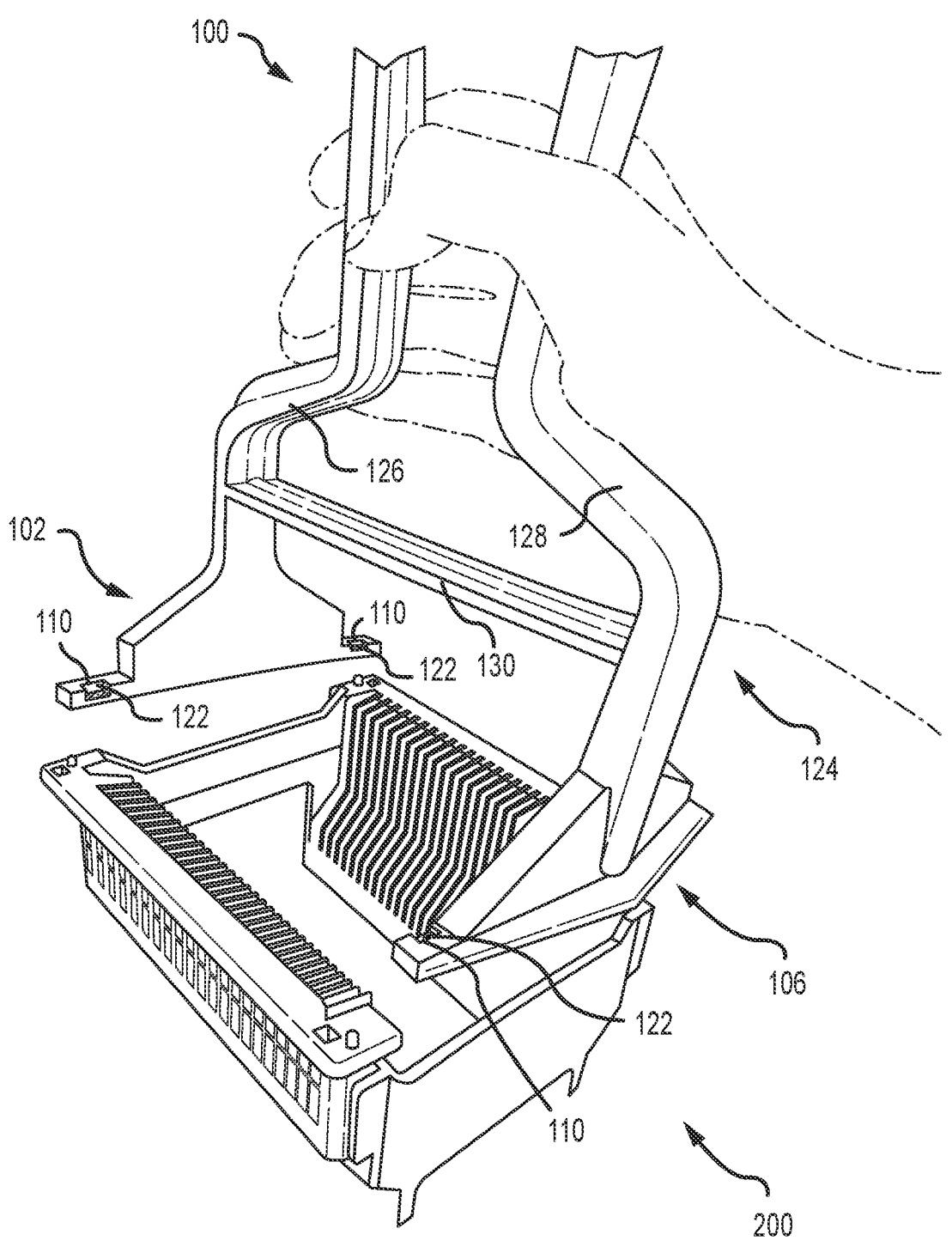
FIG. 7C illustrates the cassette handle of FIG. 7A in a rest position and above a cassette.

Referring now to FIGS. 7A and 7C, the cassette handle 100 is in a rest position. No force is applied to the body 124 (e.g., to the arms 126, 128) by the operator, and the width 144 between the feet 102, 106 with the recesses 110 and the markers 122 (or, without recesses and only markers 402 as described with respect to the cassette handle 400, or with the grooves 502 and the markers 506 as described with respect to the cassette handle 500) is a first distance. In FIG. 7C, the cassette handle 100 is held by an operator above the cassette 200.

Figure 7D:
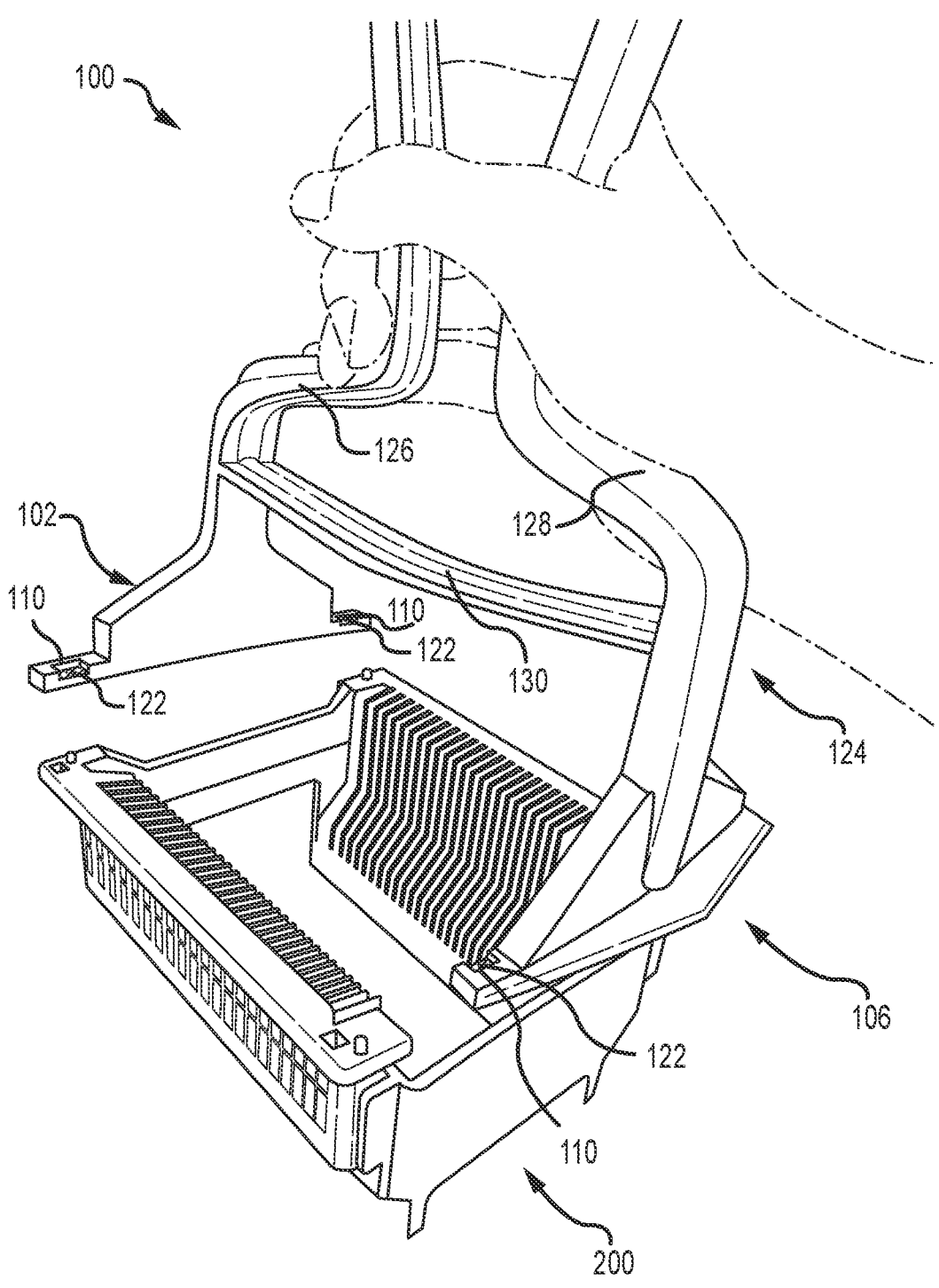
FIG. 7D illustrates the cassette handle of FIG. 7C in an open position and above the cassette.

Referring now to FIGS. 7B and 7D, the cassette handle 100 is in an open position. A force is applied to the body 124 (e.g., to the arms 126, 128) by the operator, causing the feet 102, 106 to move away from the longitudinal axis A. The width 144 between the feet 102, 106 with the recesses 110 and the markers 122 (or, without recesses and only markers 402 as described with respect to the cassette handle 400, or with the grooves 502 and the markers 506 as described with respect to the cassette handle 500) is increased to a second, greater distance. In embodiments, the crossmember 130 and/or the head 134 may flex or bend (i.e., similar to a living hinge) to allow for the movement of the feet 102, 106. In FIG. 7D, the cassette handle 100 is held by an operator above the cassette 200.

Figure 7E:
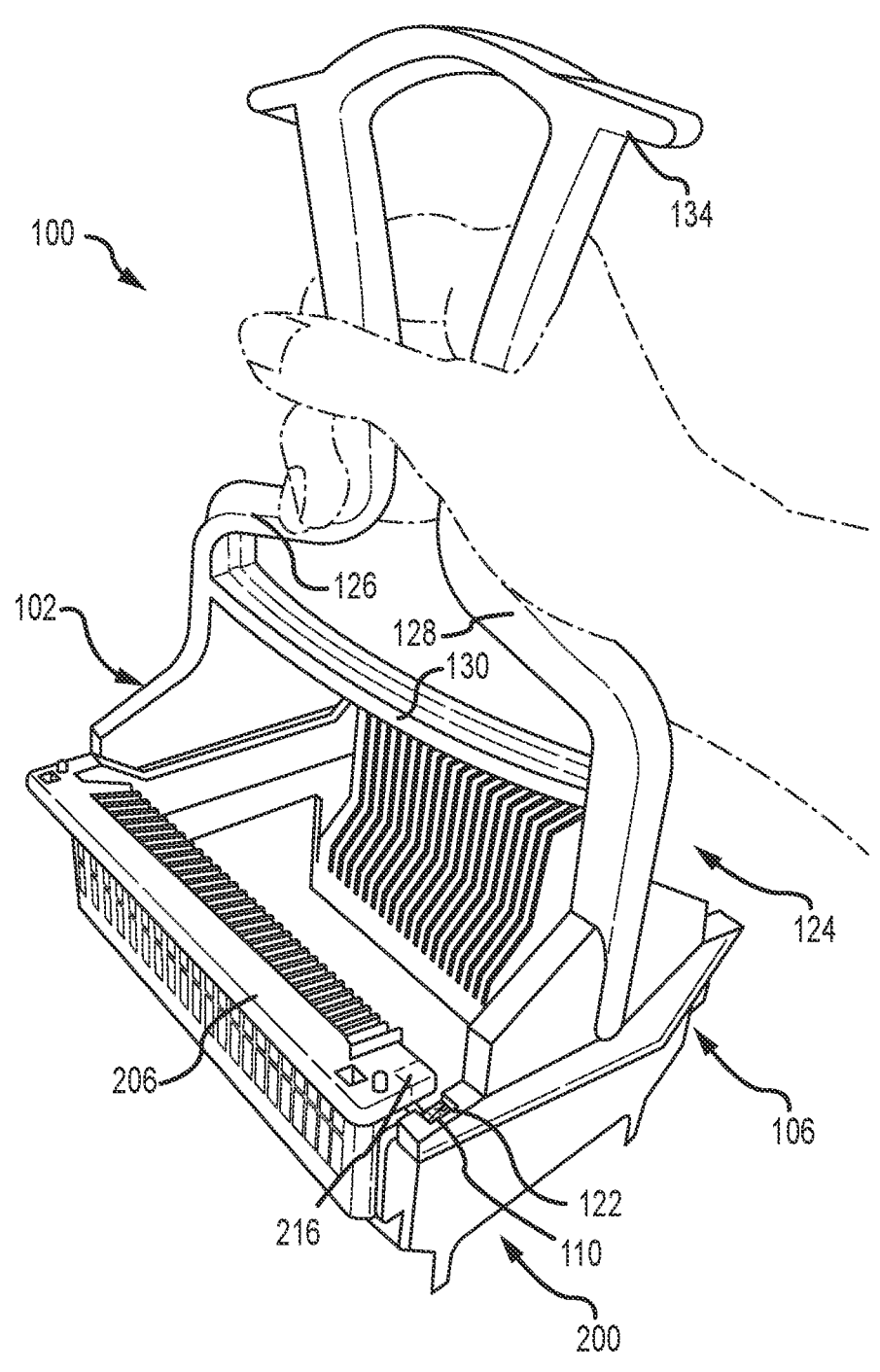
FIG. 7E illustrates the cassette handle of FIG. 7D in the open position and surrounding the cassette.

FIG. 7E illustrates the cassette handle 100 in the open position and surrounding the cassette 200. While the force is applied to the cassette handle 100 by the operator, the operator positions the cassette handle 100 so that the feet 102, 106 are proximate to the protrusions 216 and/or the rim 206 of the cassette 200. It is noted that the protrusions 216 are shown FIG. 7E in broken line form through the foot 102, 106 for purposes of clarity only.

Figure 7F:
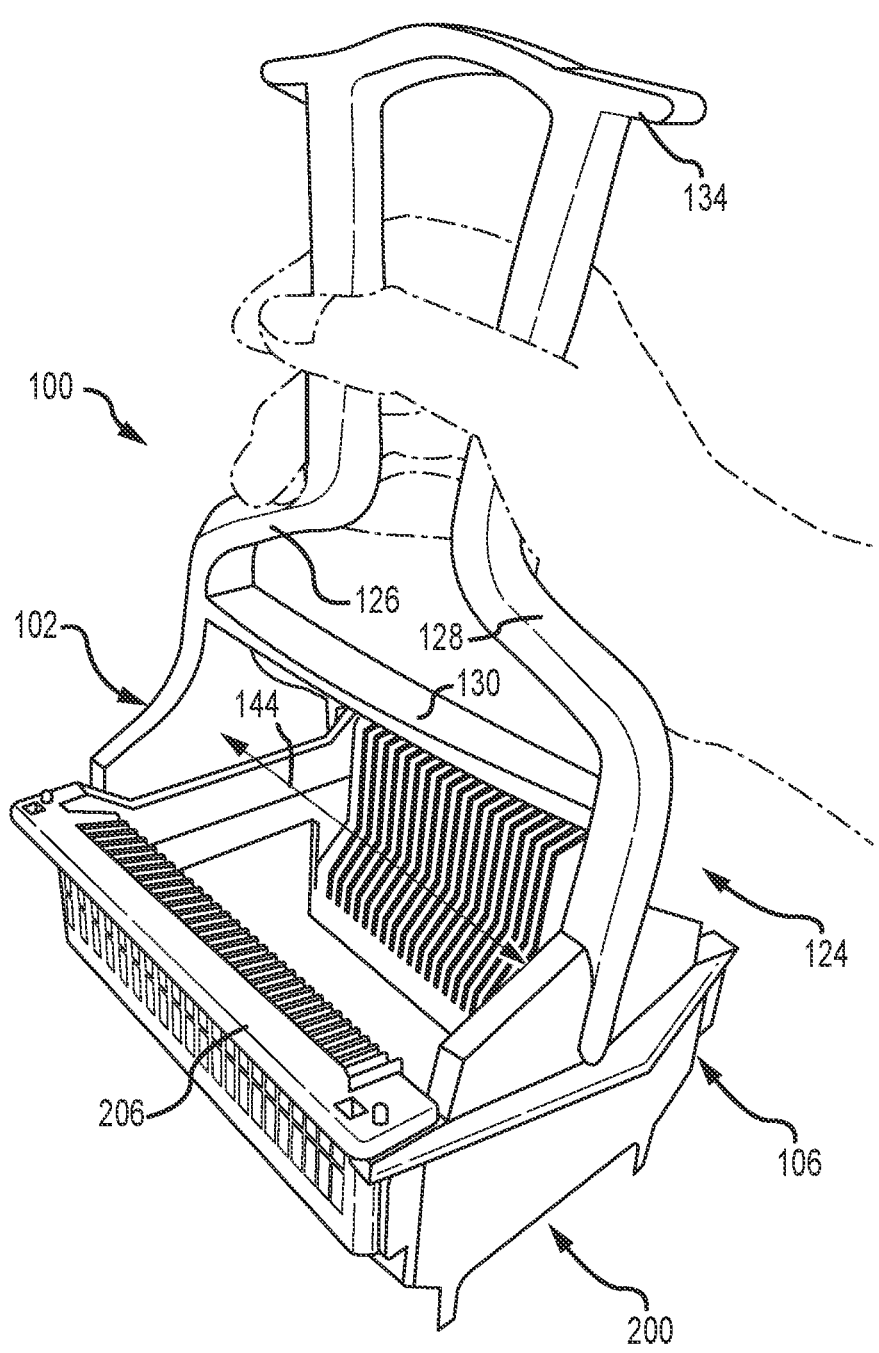
FIG. 7F illustrates the cassette handle of FIG. 7E in a closed position and engaging the cassette.

FIG. 7F illustrates the cassette handle 100 in a closed position and engaging the cassette. After the cassette handle 100 is positioned so that the feet 102, 106 are proximate to the protrusions 216 and/or the rim 206 of the cassette 200, the operator removes the force from the body 124 (e.g., to the arms 126, 128). The feet 102, 106 move toward the longitudinal axis A. The width 144 between the feet 102, 106 with the recesses 110 and the markers 122 (or, without recesses and only markers 402 as described with respect to the cassette handle 400, or with the grooves 502 and the markers 506 as described with respect to the cassette handle 500) is decreased to approximately the first distance. It is noted that the movement or return toward the longitudinal axis A may be assisted by the crossmember 130 and/or the head 134 unflexing or unbending (i.e., similar to a living hinge).

When the cassette handle 100 is correctly coupled to the cassette 200 following the removal of the applied force, the recesses 110 and the markers 122 (or, without recesses and only markers 402 as described with respect to the cassette handle 400, or with the grooves 502 and the markers 506 as described with respect to the cassette handle 500) and the protrusions 516 and/or at least a portion of the rim 506 should not be visible to the operator. The provides a visual indicator to the operator of the correct coupling. In addition, the correct coupling of the cassette handle 100 to the cassette 200 may be observed by the operator via an aural indicator (e.g., a snapping or clicking sound) and/or a tactile indicator (e.g., felt via touch by the operator through the cassette handle 200), including where the protrusions 216 and/or at least a portion of the rim 206 engages a recess on the cassette handle 200.

It should be understood that the first distance of the width 144 for the rest position and the distance of the width 144 for the closed position may be the same, substantially similar, or approximately similar. For example, the width 144 for the rest position may be approximately similar to (but slightly less than) the width 144 for the closed position, as the width 144 for the rest position being narrower may promote a sufficient amount of force being applied to the cassette 200 by the cassette holder 100 to maintain the engagement between the feet 102, 106 and the rim 206 and/or the protrusions 216 of the cassette 200. Alternatively, the distance of the width 144 for the rest position and the closed position may be the same or substantially similar, as the distance of the width 144 for the rest position is itself sufficient to promote the engagement by the width 144 of the closed position. In general, it should be understood that the width 144 between the feet 102, 106 in the rest position or in the closed position may be any distance that promotes a sufficient amount of force being applied to the cassette 200 by the cassette holder 100 to maintain the engagement between the feet 102, 106 and the rim 206 and/or the protrusions 216 of the cassette 200.

In this regard, advantages of the present disclosure include, but are not limited to, cassette handle, including for use with a cassette for semiconductor wafers or samples. In particular, advantages of the present disclosure are directed to a cassette handle with a body, a first foot, and a second foot. When in a position following the application of a force to the body, the first foot and the second foot can engage a cassette for semiconductor wafers or samples. When in another position following the removal of the applied force, or absent an application of a force to the body, the first foot and the second foot are disengaged from the cassette.

Advantages of the present disclosure also include, but are not limited to, visual, aural, and/or tactile indicators that illustrate when the cassette handle is properly or corrected coupled to the cassette. Recesses and/or markers on the first foot and the second foot indicate when the first foot and the second foot are correctly engaged with the cassette. Where the cassette handle includes both recesses and markers, the markers may be inset within the recesses.

While various embodiments of the present disclosure have been described in detail, it is apparent that modifications and alterations of those embodiments will occur to those skilled in the art. However, it is to be understood that such modifications and alterations are within the scope and spirit of the present disclosure, as set forth in the following claims. Further, the disclosure described herein is capable of other embodiments and of being practiced or of being carried out in various ways. It is to be understood that the phraseology and terminology used herein is for the purpose of description and should not be regarded as limiting.

What is claimed is:

1. A cassette handle, comprising:

a body to receive a force;

a first foot in communication with a first side of the body, the first foot including a first set of recesses;

a second foot in communication with a second side of the body, the second foot including a second set of recesses;

a first arm in communication with the first foot;

a second arm in communication with the second foot; and a crossmember positioned between and in communication with the first arm and the second arm, wherein, when the force is applied to the body, the first foot and the second foot actuate between a first position and a second position, wherein, when the first foot and the second foot are in the first position, the first set of recesses and the second set of recesses are disengaged from a cassette, and wherein, when the first foot and the second foot are in the second position, the first set of recesses and the second set of recesses engage the cassette.

2. The cassette handle of claim 1, wherein the first set of recesses are within a first set of surfaces of the first foot, wherein the second set of recesses are within a second set of surfaces of the second foot, wherein, when the first foot and the second foot are in the first position, the first set of recesses and the second set of recesses are disengaged from a respective set of protrusions on the cassette, and wherein, when the first foot and the second foot are in the second position, the first set of recesses and the second set of recesses engage the respective set of protrusions on the cassette.

3. The cassette handle of claim 2, wherein the first set of recesses includes a first set of markers, wherein the second set of recesses includes a second set of markers, wherein, when the first foot and the second foot are in the first position, the first set of recesses and the second set of recesses are disengaged from the respective set of protrusions of the cassette such that the first set of markers and the second set of markers are visible, and wherein, when the first foot and the second foot are in the second position, the first set of recesses and the second set of recesses engage the respective set of protrusions of the cassette such that the first set of markers and the second set of markers are not visible.

4. The cassette handle of claim 1, wherein the first set of recesses are within a first sidewall of the first foot, wherein the second set of recesses are within a second sidewall of the second foot, wherein, when the first foot and the second foot are in the first position, the first set of recesses and the second set of recesses are disengaged from a respective rim on the cassette, and wherein, when the first foot and the second foot are in the second position, the first set of recesses and the second set of recesses engage the respective rim on the cassette.

5. The cassette handle of claim 4, wherein the first set of recesses includes a first set of markers, wherein the second set of recesses includes a second set of markers, wherein, when the first foot and the second foot are in the first position, the first set of recesses and the second set of recesses are disengaged from the respective rim of the cassette such that the first set of markers and the second set of markers are visible, and wherein, when the first foot and the second foot are in the second position, the first set of recesses and the second set of recesses engage the respective rim of the cassette such that the first set of markers and the second set of markers are not visible.

6. The cassette handle of claim 1, wherein a longitudinal axis is defined through the body, wherein, when the first foot and the second foot are in the first position, the first foot and the second foot are at a first distance relative to the longitudinal axis through the body, wherein, when the first foot and the second foot are in the second position, the first foot and the second foot are at a second distance relative to the longitudinal axis through the body, and wherein the first distance is greater than the second distance.

7. The cassette handle of claim 1, wherein the first arm, the second arm, and the crossmember at least partially define a cavity within the body.

8. The cassette handle of claim 7, wherein, when the force is applied to the first arm and the second arm, the crossmember flexes in response to the force applied to the first arm and the second arm, and wherein the first foot and the second foot transitions between the first position and the second position via the force applied to the first arm and the second arm.

9. The cassette handle of claim 8, wherein the crossmember becomes concave relative to the cavity defined within the body via the force applied to the first arm and the second arm.

10. The cassette handle of claim 7, wherein the body further comprises:

a head coupled to the first arm and the second arm, wherein the first arm, the second arm, the crossmember, and the head define the cavity within the body, and wherein the head flexes in response to the force applied to the first arm and the second arm.

11. The cassette handle of claim 10, wherein the head becomes concave relative to the cavity defined within the body via the force applied to the first arm and the second arm.

12. The cassette handle of claim 1, further comprising:

a first leg, wherein the first foot is coupled to the first side of the body via the first leg; and a second leg, wherein the second foot is coupled to the second side of the body via the second leg.

13. A cassette handle, comprising:

a body to receive a force;

a first foot in communication with a first side of the body, the first foot including a first set of markers; and a second foot in communication with a second side of the body, the second foot including a second set of markers;

wherein, when the force is applied to the body, the first foot and the second foot actuate between a first position and a second position, wherein, when the first foot and the second foot are in the first position, the first foot and the second foot are disengaged from a cassette such that the first set of markers and the second set of markers are visible, and wherein, when the first foot and the second foot are in the second position, the first foot and the second foot engage with the cassette such that the first set of markers and the second set of markers are not visible.

14. The cassette handle of claim 13, wherein the first set of markers are positioned in a first set of recesses within a first set of surfaces of the first foot, wherein the second set of markers are positioned in a second set of recesses within a second set of surfaces of the second foot, wherein, when the first foot and the second foot are in the first position, the first set of recesses and the second set of recesses are disengaged from a respective set of protrusions on the cassette such that the first set of markers and the second set of markers are visible, and wherein, when the first foot and the second foot are in the second position, the first set of recesses and the second set of recesses engage the respective set of protrusions on the cassette such that the first set of markers and the second set of markers are not visible.

15. The cassette handle of claim 13, wherein the first set of markers are positioned on a first set of surfaces of the first foot, wherein the second set of markers are positioned on a second set of surfaces of the second foot, wherein, when the first foot and the second foot are in the first position, the first set of surfaces and the second set of surfaces are disengaged from the cassette such that the first set of markers and the second set of markers are visible, and wherein, when the first foot and the second foot are in the second position, the first set of surfaces and the second set of surfaces engage the cassette such that the first set of markers and the second set of markers are not visible.

16. The cassette handle of claim 13, wherein the first set of markers are positioned in a first set of recesses within a first sidewall of the first foot, wherein the second set of markers are positioned in a second set of recesses within a second sidewall of the second foot, wherein, when the first foot and the second foot are in the first position, the first set of recesses and the second set of recesses are disengaged from a respective rim on the cassette such that the first set of markers and the second set of markers are visible, and wherein, when the first foot and the second foot are in the second position, the first set of recesses and the second set of recesses engage the respective rim on the cassette such that the first set of markers and the second set of markers are not visible.

17. The cassette handle of claim 13, wherein the body comprises:

a first arm in communication with the first foot;

a second arm in communication with the second foot; and a crossmember positioned between and in communication with the first arm and the second arm, wherein the first arm, the second arm, and the crossmember at least partially define a cavity within the body.

18. The cassette handle of claim 17, wherein, when the force is applied to the first arm and the second arm, the crossmember flexes in response to the force applied to the first arm and the second arm, and wherein the first foot and the second foot transitions between the first position and the second position via the force applied to the first arm and the second arm.

19. The cassette handle of claim 18, wherein the crossmember becomes concave relative to the cavity defined within the body via the force applied to the first arm and the second arm.

20. The cassette handle of claim 17, wherein the body further comprises:

a head coupled to the first arm and the second arm, wherein the first arm, the second arm, the crossmember, and the head define the cavity within the body, and wherein the head flexes in response to the force applied to the first arm and the second arm.

* * * * *